(12) United States Patent
Byun et al.

(10) Patent No.: US 11,386,847 B2
(45) Date of Patent: Jul. 12, 2022

(54) ORGANIC LIGHT EMITTING DIODE DISPLAY DEVICE

(71) Applicant: Samsung Display Co., Ltd., Yongin-si (KR)

(72) Inventors: Min Woo Byun, Seongnam-si (KR); Ji Su Na, Yongin-si (KR); Jong Won Park, Yongin-si (KR); Yang Wan Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/144,850

(22) Filed: Jan. 8, 2021

(65) Prior Publication Data

US 2021/0335268 A1 Oct. 28, 2021

(30) Foreign Application Priority Data

Apr. 27, 2020 (KR) .................. 10-2020-0050863

(51) Int. Cl.
*G09G 3/3266* (2016.01)
*G09G 3/3233* (2016.01)

(52) U.S. Cl.
CPC ......... *G09G 3/3266* (2013.01); *G09G 3/3233* (2013.01); *G09G 2310/0202* (2013.01); *G09G 2310/0243* (2013.01); *G09G 2310/08* (2013.01)

(58) Field of Classification Search
None
See application file for complete search history.

(56) References Cited

U.S. PATENT DOCUMENTS

| 9,318,047 | B2 | 4/2016 | Hsu et al. | |
|---|---|---|---|---|
| 2018/0166017 | A1* | 6/2018 | Li | G09G 3/3233 |
| 2021/0201752 | A1* | 7/2021 | Feng | G09G 3/20 |
| 2021/0209995 | A1* | 7/2021 | Feng | G11C 19/28 |

FOREIGN PATENT DOCUMENTS

| CN | 110706671 A | 1/2020 |
|---|---|---|
| KR | 10-0652382 B1 | 12/2006 |
| KR | 10-1169053 B1 | 7/2012 |
| KR | 10-1314088 B1 | 10/2013 |

* cited by examiner

*Primary Examiner* — Matthew Yeung
(74) *Attorney, Agent, or Firm* — Lewis Roca Rothgerber Christie LLP

(57) ABSTRACT

An organic light emitting diode (OLED) display includes: a display area comprising a plurality of pixel rows configured to emit light in response to a light emission signal; a light emission signal generator at the periphery of the display area, and including a plurality of light emission signal stages connected to the plurality of pixel rows; and a first high voltage transmission line and a second high voltage transmission line connected to the light emission signal generator, wherein the first high voltage transmission line is connected to a plurality of odd-numbered light emission signal stages among the plurality of light emission signal stages, and the second high voltage transmission line is connected to a plurality of even-numbered light emission signal stages among the plurality of light emission signal stages.

19 Claims, 13 Drawing Sheets

ORGANIC LIGHT EMITTING DIODE DISPLAY DEVICE

CROSS-REFERENCE TO RELATED APPLICATION

The present application claims priority to and the benefit of Korean Patent Application No. 10-2020-0050863 filed in the Korean Intellectual Property Office on Apr. 27, 2020, the entire content of which is incorporated herein by reference.

BACKGROUND

1. Field

Aspects of some example embodiments of the present disclosure relate to an organic light emitting diode (OLED) display.

2. Description of the Related Art

A display device is a device that is capable of displaying images (e.g., static or video images), and recently, organic light emitting diode (OLED) displays have attracted attention in the consumer market.

Organic light emitting diode displays generally have a self-luminous characteristic, and because it does not utilize a separate light source (e.g., a backlight), unlike a liquid crystal display device, organic light emitting diode displays can have a relatively small thickness and weight. In addition, the organic light emitting diode display exhibits high-quality characteristics such as low power consumption, high luminance, high response speed, and the like.

Because the organic light emitting diode displays emit light by itself, an organic light emitting diode of each pixel can individually emit light. For this purpose, a light emission signal generator can be included, and a light emission signal is transmitted to each pixel such that the organic light emitting diode can emit light.

In this case, a signal input to or output from the light emission signal generator may be interfered with by a signal applied to an adjacent light emission signal generator, thereby causing a signal drop.

The above information disclosed in this Background section is only for enhancement of understanding of the background and therefore the information discussed in this Background section does not necessarily constitute prior art.

SUMMARY

Aspects of some example embodiments of the present disclosure relate to an organic light emitting diode (OLED) display, and for example, to an organic light emitting diode display including a light emission signal generator.

Aspects of some example embodiments may reduce a signal change due to interference of signals input to and output from adjacent light emission signal generators.

The characteristics of embodiments according to the present invention are not limited to the above-described characteristics, and can be variously extended in a range that does not deviate from the spirit and scope of embodiments according to the present invention.

An organic light emitting diode (OLED) display according to some example embodiments includes: a display area that emits light by receiving a light emission signal and includes a plurality of pixel rows; a light emission signal generator at the periphery of the display area, and includes a plurality of light emission signal stages connected to the plurality of pixel rows; and a first high voltage transmission line and a second high voltage transmission line connected to the light emission signal generator, wherein the first high voltage transmission line may be connected to a plurality of odd-numbered light emission signal stages among the plurality of light emission signal stages, and the second high voltage transmission line may be connected to a plurality of even-numbered light emission signal stages among the plurality of light emission signal stages.

According to some example embodiments, the first high voltage transmission line and the second high voltage transmission line may be insulated from each other.

According to some example embodiments, the plurality of light emission signal stages are sequentially arranged, and include a first light emission signal stage, a second light emission signal stage, a third light emission signal stage, a fourth light emission signal stage, and a fifth light emission signal stage to which a high voltage is sequentially applied, the first light emission signal stage, the third light emission signal stage, and the fifth light emission signal stage may receive a first high voltage from the first high voltage transmission line, and the second light emission signal stage and the fourth light emission signal stage may receive a second high voltage from the second high voltage transmission line.

According to some example embodiments, the first light emission signal stage, the third light emission signal stage, and the fifth light emission signal stage may sequentially receive the first high voltage with a four horizontal period difference, and the second light emission signal stage and the fourth light emission signal stage may sequentially receive the second high voltage with a four horizontal period difference.

According to some example embodiments, the OLED display may further include a scan signal generator between the display area and the light emission signal generator.

According to some example embodiments, a previous stage scan signal may be applied during latter two horizontal periods of the four horizontal periods.

According to some example embodiments, each of the plurality of light emission signal stages may include a first clock input terminal and a second clock input terminal that receive two clock signals, a control terminal that receives the light emission signal from a light emission signal stage of the previous stage, and an output terminal that outputs the light emission signal, each of the plurality of light emission signal stages may include a high-level output portion and a low-level output portion, the high-level output portion may output a high voltage to the output terminal and the low-level output portion may output a low voltage to the output terminal.

According to some example embodiments, the plurality of light emission signal stages may be connected to two pixel rows among the plurality of pixel rows and may apply a light emission signal to the plurality of pixel rows.

According to some example embodiments, the plurality of pixel rows may include a first pixel row, a second pixel row, a third pixel row, a fourth pixel row, a fifth pixel row, a sixth pixel row, a seventh pixel row, and an eighth pixel row that are sequentially arranged, the plurality of light emission signal stages may include a first light emission signal stage, a second light emission signal stage, a third light emission signal stage, and a fourth light emission signal stage that are sequentially arranged, the first light emission signal stage may be connected to the first pixel row and the second pixel row, the second light emission signal stage may be connected to the third pixel row and the fourth pixel row, the third light emission signal stage may be connected to the fifth pixel row and the sixth pixel row, the fourth light emission signal stage may be connected to the seventh pixel row and the eighth pixel row, the first light emission signal stage and the third light emission signal stage may receive the first high voltage through the first high voltage transmission line, and the second light emission signal stage and the fourth light emission signal stage may receive the second high voltage through the second high voltage transmission line.

According to some example embodiments, the first light emission signal stage and the third light emission signal stage may sequentially receive the first high voltage with a four horizontal period difference, and the second light emission signal stage and the fourth light emission signal stage may sequentially receive the second high voltage with a four horizontal period difference.

An OLED display according to some example embodiments includes: a display area that emits light by receiving a light emission signal and includes a plurality of pixel rows; a first light emission signal generator and a second light emission signal generator at opposite sides of the display area, and include a plurality of light emission signal stages connected to the plurality of pixel rows; and two first high voltage transmission lines and two second high voltage transmission lines that are at opposite sides of the display area, and are connected to the light emission signal generator, wherein the two first high voltage transmission lines may be connected to a plurality of odd-numbered light emission signal stages among the plurality of light emission signal stages, the two second high voltage transmission lines may be connected to a plurality of even-numbered light emission signal stages among the plurality of light emission signal stages, and the two first high voltage transmission lines may be connected with each other and the two second high voltage transmission lines may be connected with each other.

According to some example embodiments, it may be possible to increase the accuracy of a signal of the light emission signal generator by reducing a signal change due to interference of a signal input and output to an adjacent light emission signal generator.

The characteristics of embodiments according to the present invention are not limited to the above-described characteristics, and embodiments according to the present invention can be variously extended in a range that does not deviate from the spirit and scope of embodiments according to the present invention.

DETAILED DESCRIPTION

Figure 1:
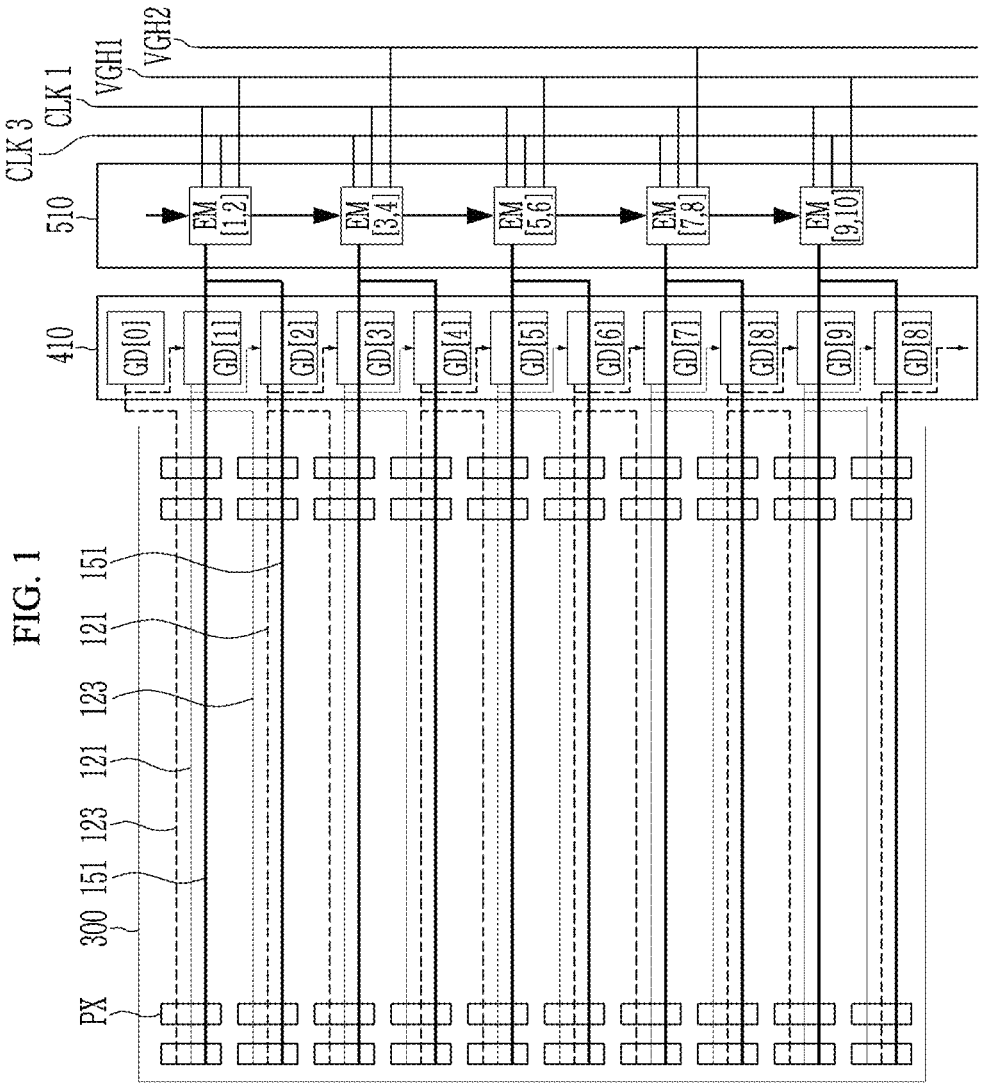
FIG. 1 is a block diagram of an OLED display according to some example embodiments.

Aspects of some example embodiments of the present invention will be described more fully hereinafter with reference to the accompanying drawings, in which example embodiments of the invention are shown. As those skilled in the art would realize, the described example embodiments may be modified in various different ways, all without departing from the spirit or scope of embodiments according to the present invention.

Accordingly, the drawings and description are to be regarded as illustrative in nature and not restrictive, and like reference numerals designate like elements throughout the specification.

Because the size and thickness of each configuration shown in the drawings are arbitrarily shown for better understanding and ease of description, embodiments according to the present invention are not limited thereto, and the thicknesses of portions and regions are exaggerated for clarity. In the drawings, the thickness of layers, films, panels, regions, etc., are exaggerated for clarity. In addition, in the drawings, the thickness of some layers and regions is exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to be positioned above or below the target element, and will be necessarily not understood to be positioned "at an upper side" based on a opposite direction of gravity.

In addition, unless explicitly described to the contrary, the word "comprise" and variations such as "comprises" or "comprising" will be understood to imply the inclusion of stated elements but not the exclusion of any other elements.

Further, throughout the specification, the phrase "on a plane" means viewing a target portion from the top, and the word "on a cross-section" means viewing a cross-section formed by vertically cutting a target portion from the side.

In addition, throughout the specification, the expression "connected to", does not necessarily mean that two or more constituent elements are directly connected, but two or more constituent elements may be indirectly connected through other constituent elements, and may be connected not only electrically but also physically, or may be connected differently depending on position or function, while being integral.

First, referring to FIG. 1, and organic light emitting diode (OLED) display according to some example embodiments will be described. FIG. 1 is a block diagram of an OLED display according to some example embodiments.

Referring to FIG. 1, an OLED display according to some example embodiments includes a display area 300 and a non-display area at the periphery of the display area 300.

The display area 300 includes a plurality of pixels PX and signal lines 121, 123, and 125 connected to the plurality of pixels PX.

The non-display area includes a scan signal generator 410 and a light emission signal generator 510 for driving the pixels PX, and a first clock signal transmission line CLK1, a third clock signal transmission line CLK3, a first high voltage transmission line VGH1, and a second high voltage transmission line VGH2 that are connected to the scan signal generator 410 and the light emission signal generator 510. The first high voltage transmission line VGH1 and the second high voltage transmission line VGH2 are electrically insulated and thus may individually transmit high voltages.

The non-display area may further include another driver such as a data driver in addition to the scan signal generator 410 and the light emission signal generator 510. In addition, according to some example embodiments, the non-display area may further include a low voltage transmission line.

The plurality of pixels PX of the display area 300 are arranged in a row direction and a column direction. However, this is not restrictive, and the alignment of the plurality of pixels PX can be changed. According to some example embodiments, each pixel PX includes a pixel circuit portion formed on a substrate and a light emission element portion formed on the pixel circuit portion. The light emitting element portion includes an organic light emitting diode (OLED), and receives a current from the pixel circuit portion and emits light according to intensity of the current.

Each pixels PX is connected to signal lines 121, 123, and 151, and the signal lines 121, 123, and 151 include a scan line 121, a previous stage scan line 123, and a light emission signal line 151. According to some example embodiments, the signal line may further include a data line connected to the data driver.

The scan line 121, the previous stage scan line 123, and the light emission signal line 151 extend in a first direction, and the data line may extend in a second direction that is different from the first direction.

The scan signal generator 410 includes a plurality of scan signal stages GD. Each scan signal stage GD generates and outputs a gate signal, and the output gate signal is transmitted to pixels PX included in the present stage pixel row through the scan line 121 and transmitted to pixels PX included in the next pixel row through the previous stage scan line 123. In addition, each scan signal stage GD applies a gate signal as a carry signal to a scan signal stage GD of the next stage. The gate signal is alternately applied with a gate-on voltage and a gate-off voltage, and includes at least one gate-on voltage during one frame.

The scan signal generator 410 may further include a 0-th scan signal stage GD[0] to apply a gate signal to the previous stage scan line 123 connected to pixels in the first pixel row.

According to some example embodiments, the light emission signal generator 510 is located outside the scan signal generator 410.

The light emission signal generator 510 includes a plurality of light emission signal stages EM. A single light emission signal line 151 is connected one corresponding light emission signal stage EM and thus receives a light emission signal from the light emission signal stage EM.

A light emission signal output from one light emission signal stage EM is formed to be simultaneously (or concurrently) applied to pixels PX connected to two pixel rows. That is, in FIG. 1, the light emission signal stage indicated by EM[1,2] indicates that the emission signal is simultaneously (or concurrently) applied to the first pixel row and the second pixel row. However, according to some example embodiments, a light emission signal may be applied to only one pixel row or may be collectively applied to three or more pixel rows. As described, one light emission signal stage EM may be connected with n light emission signal lines 151, and may simultaneously (or concurrently) apply a light emission signal to pixels PX included in n pixel rows. Here, n is a natural number of 1 or more.

In FIG. 1, a first light emission signal stage EM[1,2], a second light emission signal stage EM[3,4], a third light emission signal stage EM[5,6], a fourth light emission signal stage EM[7,8], and a fifth light emission signal stage EM[9, 10] that are sequentially positioned from the top are illustrated, but they may be only a portion thereof and the light emission signal generator 510 may include a plurality of light emission signal stages.

The first light emission signal stage EM[1,2], the second light emission signal stage EM[3,4], the third light emission signal stage EM[5,6], the fourth light emission signal stage EM[7,8], and the fifth light emission signal stage EM[9,10] are connected to a first clock signal transmission line CLK1 and a third clock signal transmission line CLK3 and thus receive clock signals.

Like the first light emission signal stage EM[1,2], the third light emission signal stage EM[5,6], and the fifth light emission signal stage EM[9,10], odd-numbered light emission signal stages are connected to a first high voltage transmission line VGH1 and thus receive a high voltage from the first high voltage transmission line VGH1. Similarly, like the second light emission signal stage EM[3,4] and the fourth light emission signal stage EM[7,8], even-numbered light emission signal stages are connected to a second high voltage transmission line VGH2 and thus receive a high voltage from the second high voltage transmission line VGH2.

As described, the odd-numbered light emission signal stages and the even-numbered light emission signal stages are connected to different high voltage transmission lines such that a change in the magnitude of the applied high voltage caused by signal interference between adjacent light emission signal stages can be reduced.

The light emission signal is alternately applied with a low level voltage (corresponding to a light emitting section) and a high level voltage (corresponding to a writing section). One frame includes one high level voltage section (the writing section). In addition, the light emission signal is applied with the low level voltage and the high level voltage for a long period of time compared to a period of time during which one gate-on voltage is applied. Due to such a feature, the light emission signal can be simultaneously (or concurrently) applied to a plurality of light emission signal lines 151. However, the period of time during which one gate-on voltage is applied is very short such that the gate signal is applied to only one scan line 121 and one previous stage scan line 123 for each scan signal stage GD.

Figure 2:
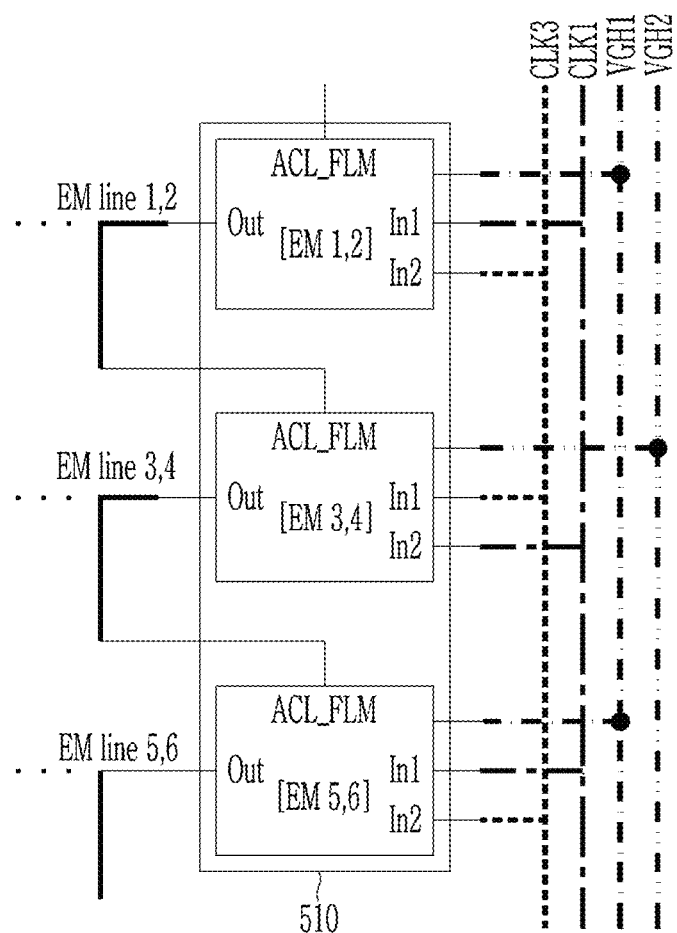
FIG. 2 is a block diagram of a part of the light emission signal generator according to some example embodiments.

Next, referring to FIG. 2, the light emission signal generator will be described in more detail. FIG. 2 is a block diagram of a part of the light emission signal generator according to some example embodiments.

Referring to FIG. 2, the light emission signal generator 510 includes a plurality of light emission signal stages EM, and is connected with a first clock signal transmission line CLK1, a third clock signal transmission line CLK3, a first high voltage transmission line VGH1, and a second high voltage transmission line VGH2.

Each light emission signal stage EM of the light emission signal generator 510 includes a first clock input terminal In1 and a second clock input terminal In2 that receive two clock signals, a control terminal ACL_FLM receiving a control signal FLM or a light emission signal from a light emission signal stage EM from the previous stage, and an output terminal Out that outputs the light emission signal.

The light emission signal stage EM[1,2] (hereinafter referred to as a first light emission stage) that applies a light emission signal to the first and second light emission signal lines EM lines 1 and 2 applies the light emission signal to pixels PX connected to the first pixel low and the second pixel row. As a result, the pixels PX connected to the first and second pixel rows simultaneously (or concurrently) emit light.

The control signal FLM is externally applied to the control terminal ACL_FLM of the first light emission signal stage EM[1,2], a first clock signal EM_CLK1 is applied to the first clock input terminal In1, and a third clock signal EM_CLK3 is applied to the second clock input terminal In2. The first light emission signal stage EM[1,2] is connected to the first high voltage transmission line VGH1 and thus receives a high voltage from the first high voltage transmission line VGH1.

The light emission signal is applied to the first and second light emission signal lines EM lines 1 and 2 through the output terminal Out of the first light emission signal stage EM[1,2].

The light emission signal output from the first light emission signal stage EM[1,2] is applied to a control terminal ACL_FLM of the next second light emission signal stage EM[3,4] as a carry signal.

The light emission signal stage EM[3,4] (hereinafter referred to as a second light emission signal stage) that applies a light emission signal to the third and fourth light emission signal lines EM lines 3 and 4 applies the light emission signal to pixels PX connected to third and fourth pixel rows. Thus, all the pixels PX connected to the third and fourth pixel rows simultaneously (or concurrently) emit light.

In the second light emission signal stage EM[3,4], the light emission signal is applied as a carry signal to the control terminal ACL_FLM from the first light emission signal stage EM[1,2], the third clock signal EM_CLK3 is applied to the first clock input terminal In1, and the first clock signal EM_CLK1 is applied to the second clock input terminal In2. Meanwhile, the second light emission signal stage EM[3,4] is connected to the second high voltage transmission line VGH and thus receives a high voltage from the second high voltage transmission line VGH2.

In addition, the light emission signal is applied to the third and fourth light emission signal lines EM lines 3 and 4 through the output terminal Out of the second light emission signal stage EM[3,4].

Meanwhile, the light emission signal output from the second light emission signal stage EM[3,4] is a carry signal, and is applied to the control terminal ACL_FLM of the third light emission signal stage EM[5,6].

The light emission signal stage EM[5,6] (hereinafter referred to as a third light emission signal stage) that applies the light emission signal to fifth and sixth light emission signal lines EM lines 5 and 6 applies the light emission signal to pixels PX connected to fifth and sixth pixel rows. Thus, all the pixels PX connected to the fifth and sixth pixel rows simultaneously (or concurrently) emit light.

In the third light emission signal stage EM[5,6], the light emission signal is applied as a carry signal to the control terminal ACL_FLM from the second light emission signal stage EM[3,4], the first clock signal EM_CLK1 is applied to the first clock input terminal In1, and the third clock signal EM_CLK3 is applied to the second clock input terminal In2. The third light emission signal stage EM[5,6] is connected to the first high voltage transmission line VGH1 and thus applies a high voltage from the first high voltage transmission line VGH1.

In addition, the light emission signal is applied to fifth and sixth light emission signal lines EM lines 5 and 6 through the output terminal Out of the third light emission signal stage EM[5,6].

Meanwhile, the light emission signal output from the third light emission signal stage EM[5,6] is a carry signal, and is applied to a control terminal ACL_FLM of a fourth light emission signal stage.

Through such a process, the plurality of light emission signal stages EM of the light emission signal generator 510 sequentially apply light emission signals.

Like the first light emission signal stage EM[1,2], the third light emission signal stage EM[5,6], and the fifth light emission signal stage EM[9,10], the odd-numbered light emission signal stages are connected to the first high voltage transmission line VGH1 and receive a high voltage from the first high voltage transmission line VGH1. Similarly, the even-numbered light emission signal stages like the second light emission signal stage EM[3,4] and the fourth light emission signal stage EM[7,8] are connected to the second high voltage transmission line VGH2 and thus receive a high voltage from the second high voltage transmission line VGH2.

As described, the odd-numbered light emission signal stages and the even-numbered light emission signal stages are connected to different high voltage transmission lines such that a change in the magnitude of the applied high voltage due to signal interference between adjacent light emission signals stages can be reduced. This will be described in more detail later.

According to some example embodiments, one light emission signal stage EM is connected to two pixel rows and thus applies a light emission signal thereto, but according to some example embodiments, one light emission signal stage EM is connected to three or more pixel rows and thus may apply a light emission signal thereto.

Figure 3:
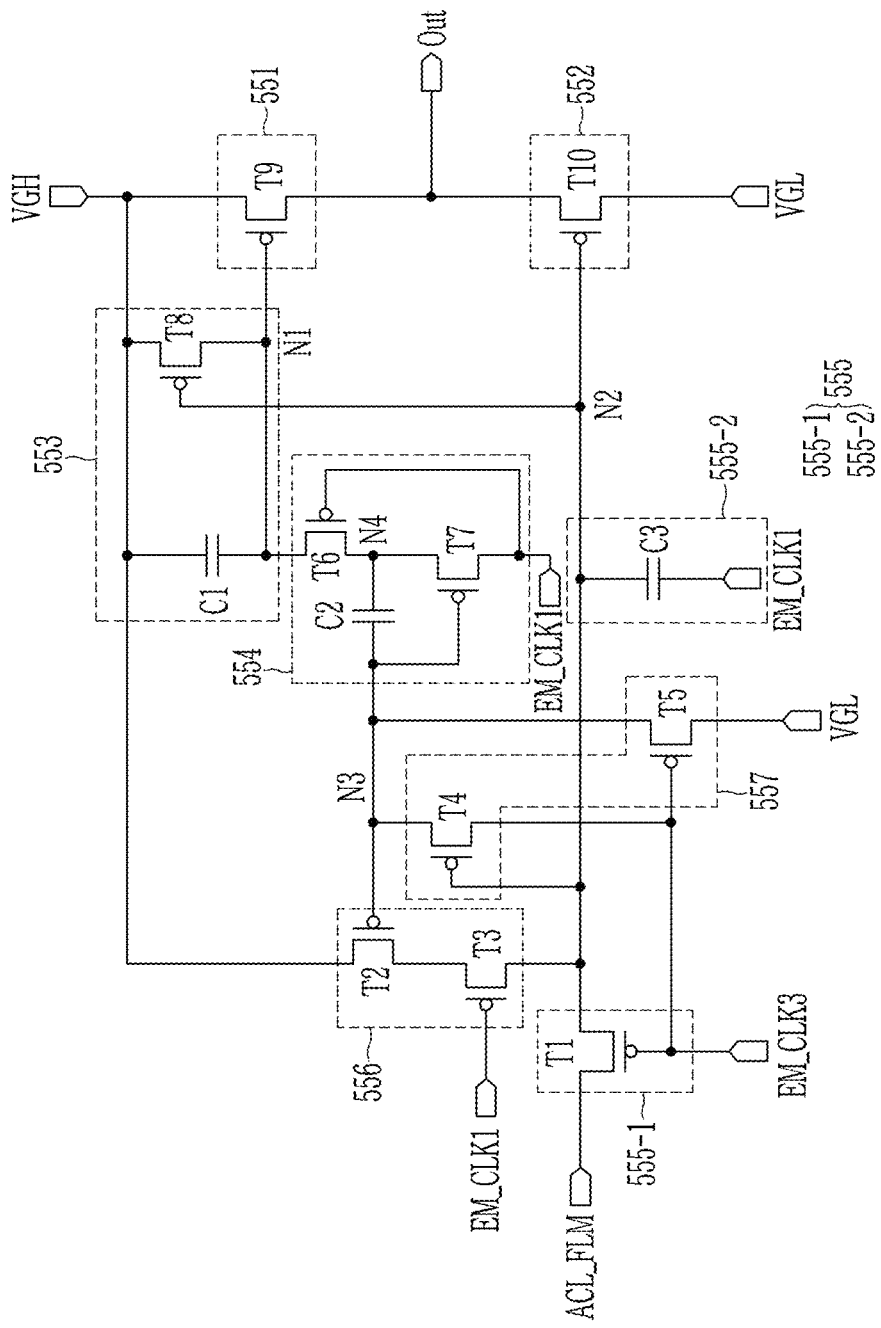
FIG. 3 is a circuit diagram of one stage in the light emission signal generator according to some example embodiments.
Figure 4:
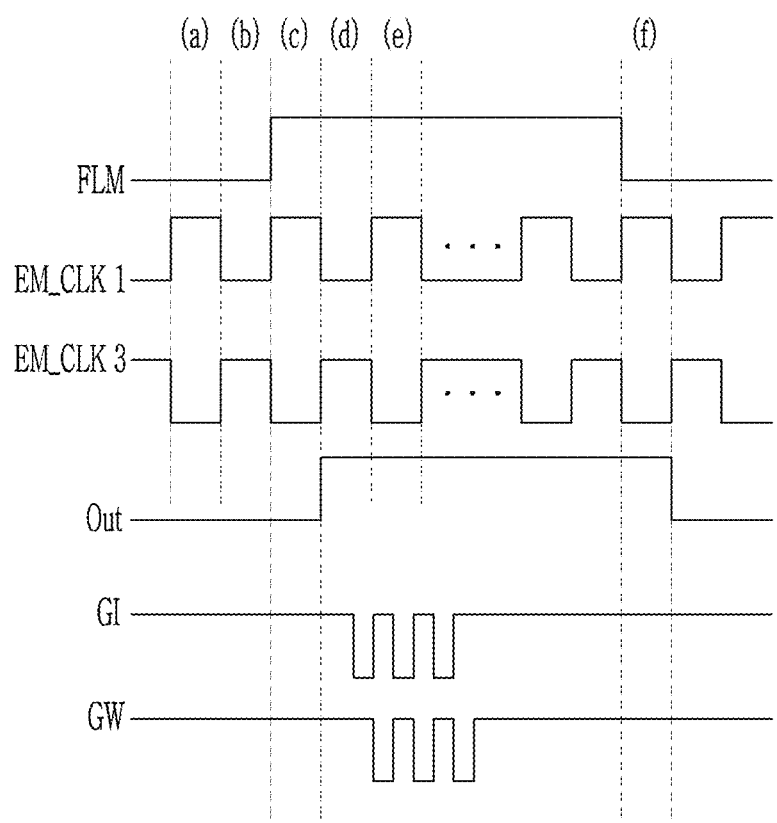
FIG. 4 is a waveform diagram of a signal applied to the stage according to some example embodiments.

Next, referring to FIG. 5 to FIG. 10, the operation of the light emission signal stage EM will be described together with FIG. 3 and FIG. 4. FIG. 3 is a circuit diagram of one stage in the light emission signal generator according to some example embodiments, and FIG. 4 is a waveform diagram of a signal applied to the stage according to some example embodiments. FIG. 5 to FIG. 10 are drawings provided for description of the operation of the stage of FIG. 3.

Each of the light emission signal stages EM of the light emission signal generator 510 according to some example embodiments includes a high level output portion 551, a low level output portion 552, a first node_first controller 553, a first node_second controller 554, a second node_first controller 555, a second node_second controller 556, and a third node controller 557.

The high level output portion 551 is a portion outputting a high voltage VGH of the light emission signal, and the low level output portion 552 is a portion outputting a low voltage VGL of the light emission signal. The high level output portion 551 and the low level output portion 552 are connected with the output terminal Out, and when the high voltage VGH is output from the high level output portion 551, the low level output portion 552 does not output the low voltage VGL, and when the low level output portion 552 outputs the low voltage VGL, the high level output portion 551 does not output the high voltage VGH.

The high level output portion 551 is controlled according to a voltage of a first node N1, and the voltage of the first node N1 is controlled by a first node_first controller 553 and a first node_second controller 554 of the first node N1.

The low level output portion 552 is controlled according to a voltage of a second node N2, and the voltage of the second node N2 is controlled by a second node_first controller 555 and a second node_second controller 556. In FIG. 3, the second node_first controller 555 is divided into a first sub-second node_first controller 555-1 and a second sub-second node_first controller 555-2.

The first node_second controller 554 is controlled by a voltage of a third node N3, and the voltage of the third node N3 is controlled by a third node controller 557.

Like the odd-numbered light emission signal stage EM of FIG. 2, in the light emission signal stage EM of FIG. 3, a first clock signal wire 171 for a clock signal is connected to the first clock input terminal In1 and thus the first clock signal EM_CLK1 is applied, and a second clock signal wire 172 for a clock signal is connected to the second clock input terminal In2 and thus the third clock signal EM_CLK3 is applied. On the contrary, a clock signal opposite to the clock signal applied to the odd-numbered light emission signal stage EM may be applied to the even-numbered light emission signal stage EM.

Each portion will now be described in detail.

The high level output portion 551 includes a ninth transistor T9, and a control electrode of the ninth transistor T9 is connected to the first node N1, an input electrode is connected to a terminal of the high voltage VGH, and an output electrode is connected to the output terminal Out. Thus, when the voltage of the first node N1 is a low voltage, the high voltage VGH is output to the output terminal Out, and when the voltage of the first node N1 is a high voltage, the ninth transistor T9 outputs nothing.

The low level output portion 552 includes a tenth transistor T10, and a control electrode of the tenth transistor T10 is connected with the second node N2, an input electrode is connected with a terminal of a low voltage VGL, and an output electrode is connected with the output terminal Out. Thus, when a voltage of the second node N2 is a low voltage, the low voltage VGL is output to the output terminal Out, and when the voltage of the second node N2 is a high voltage, the tenth transistor T10 outputs nothing.

The voltage of the first node N1 is controlled by the first node_first controller 553 and the first node_second controller 554.

The first node_first controller 553 includes one transistor (i.e., an eighth transistor) T8 and one capacitor (i.e., a first capacitor) C1. A control electrode of the eighth transistor T8 is connected to the second node N2, an input electrode is connected to the high voltage VGH, and an output electrode is connected to the first node N1. Meanwhile, two electrodes of the first capacitor C1 are respectively connected to the input electrode and the output electrode of the eighth transistor such that the first capacitor C1 is connected between the first node N1 and the high voltage VGH terminal. The eighth transistor T8 transmits the high voltage VGH to the first node N1 when the voltage of the second node N2 is a low voltage, and the first capacitor C1 stores and maintains the voltage of the first node N1. That is, the first node_first controller 553 serves to change a voltage of the first node N1 to the high voltage VGH.

Meanwhile, the first node_second controller 554 includes two transistors (i.e., a sixth transistor T6 and a seventh transistor T7) and one capacitor (i.e., a second capacitor C2). A control electrode of the sixth transistor T6 is connected to the first clock input terminal In1, an output electrode is connected to the first node N1, and an input electrode is connected to a fourth node N4. A control electrode of the seventh transistor T7 is connected to the third node N3, an output electrode is connected to the fourth node N4, and an input electrode is connected to the first clock input terminal In1. Here, the input electrode and the output electrode may have opposite inputs and outputs depending on the magnitude of the connected voltage. The first node_second controller 554 serves to change the voltage of the first node N1 to a low voltage of a clock signal.

Meanwhile, the second capacitor C2 is connected between the third node N3 and the fourth node N4, and a voltage of the fourth node N4 may be boosted up by using a voltage difference between the two nodes.

A voltage of the second node N2 is controlled by the second node_first controller 555 and the second node_second controller 556.

The second node_first controller 555 is formed of a first sub-second node_first controller 555-1 and a second sub-second node_first controller 555-2, and the first sub-second node_first controller 555-1 is formed of one transistor (i.e., a first transistor T1) and the second sub-second node_first controller 555-2 is formed of one capacitor (i.e., a third capacitor C3). A control electrode of the first transistor T1 is connected to the second clock input terminal IN2, an input electrode is connected to the control terminal ACL_FLM, and an output electrode is connected to the second node N2. One electrode of the third capacitor C3 is connected to the second node N2, and the other electrode is connected to the first clock input terminal IN1.

Due to the structure of the third capacitor C3, the voltage of the second node N2 may also change due to a variable clock signal applied to the first clock input terminal IN1. Thus, in order to reduce the fluctuation of the voltage of the second node N2, capacitance of the third capacitor C3 may be set to be high. Thus, although the clock signal applied to one side of the third capacitor C3 is changed, a voltage of the other side, that is, the voltage of the second node N2, is not greatly changed. Due to such a third capacitor C3, capacitance of the first clock input terminal IN1 has very high value compared to the capacitance of the second clock input terminal IN2.

The first transistor T1 included in the second node_first controller 555 changes the voltage of the second node N2 to a voltage of the control signal FLM or a light emission signal of the previous stage when a third clock signal EM_CLK applied to the second clock input terminal IN2 has a low voltage, and the third capacitor C3 stores and maintains the changed voltage. That is, the second node_first controller 555 serves to change the voltage of the second node N2 to a high voltage or a low voltage according to a carry signal (i.e., the control signal FLM or the light emission signal of the previous stage).

The second node_second controller 556 is formed of two transistors (i.e., a second transistor T2 and a third transistor T3). A control electrode of the second transistor T2 is connected to the third node N3, an input electrode is connected to the high voltage VGH terminal, and an output electrode is connected to the input electrode of the third transistor T3. A control electrode of the third transistor T3 is connected with the first clock input terminal IN1, an input electrode is connected with the output electrode of the second transistor T2, and an output electrode is connected with the second node N2. That is, the second node_second controller 556 may prevent the voltage of the second node N2 from changing to a low voltage by connecting the high voltage VGH to the second node N2.

The third node controller 557 is formed of two transistors (i.e., a fourth transistor T4 and a fifth transistor T5). A control electrode of the fourth transistor T4 is connected to the second node N2, an input terminal is connected to the second clock input terminal IN2, and an output terminal is connected to the third node N3. A control terminal of the fifth transistor T5 is connected to the second clock input terminal IN2, an input terminal is connected to the low voltage VGL terminal, and an output terminal is connected to the third node N3. The fifth transistor T5 serves to make a voltage of the third node N3 be the low voltage VGL, and the fourth transistor T4 serves to make a voltage of the third node N3 be a voltage of the second clock input terminal IN2 such that the voltage of the third node N3 becomes a high voltage (i.e., a high voltage of the clock signal).

The light emission signal stage EM having such a configuration operates according to signals applied to the first clock input terminal In1, the second clock input terminal In2, and the control terminal ACL_FLM, and this will be described with reference to FIG. 4 to FIG. 10.

FIG. 4 is a waveform of a signal applied to the stage according to some example embodiments, and FIG. 5 to FIG. 10 are provided for description of the operation of the stage of FIG. 3.

First, signals applied to the first clock input terminal In1, the second clock input terminal In2, and the control terminal ACL_FLM of the light emission signal stage EM will be described with reference to FIG. 4. According to some example embodiments, the first clock signal EM_CLK1 is applied to the first clock input terminal In1, and the third clock signal EM_CLK3 is applied to the second clock input terminal In2. The first clock signal EM_CLK1 and the third clock signal EM_CLK3 are clock signals in which high voltage and low voltage are repeated, and have inversion characteristics with respect to each other.

Meanwhile, an externally applied control signal FLM is transmitted as a carry signal to the control terminal ACL_FLM of the first light emission signal stage EM[1,2], and an output signal of the previous light emission signal stage is transmitted as a carry signal from the second light emission signal stage EM[3,4]. The control signal FLM and the light emission signal have one high-voltage section during one frame, and are applied with low voltages during remaining sections. The high-voltage section is a section (i.e., a writing section) during which a data voltage is written into the pixel PX, and the pixel PX emits light during the low-voltage section (i.e., a light emission section).

In FIG. 4, a scan signal GI and a previous-stage scan signal GW are illustrated. In FIG. 4, the scan signal is applied with a low voltage three times during one frame period, but this is just an example, and according to some example embodiments, the scan signal may be applied with a low voltage once or applied with a low voltage a number of times different from once or three times. The present-stage scan signal GI and the previous-stage scan signal GW applied to one pixel PX should exist during one high-voltage section (i.e., a writing section) of a light emission signal applied to the corresponding pixel PX.

In FIG. 4, a voltage applied to the light emission signal stage is divided into (a), (b), (c), (d), (e), and (f) per section. Operation of the light emission signal stage for each section will now be described with reference to FIG. 5 to FIG. 10. In FIG. 5 to FIG. 10, when the transistor is turned off, it is marked with an X, and when the transistor is turned on and performs main operations, it is marked with a straight line that connects an input electrode and an output electrode of the transistor. In addition, the voltages at the first to fourth nodes N1, N2, N3, and N4 are shown in parentheses for easy viewing. H in parentheses means a high voltage and L means a low voltage.

Figure 5:
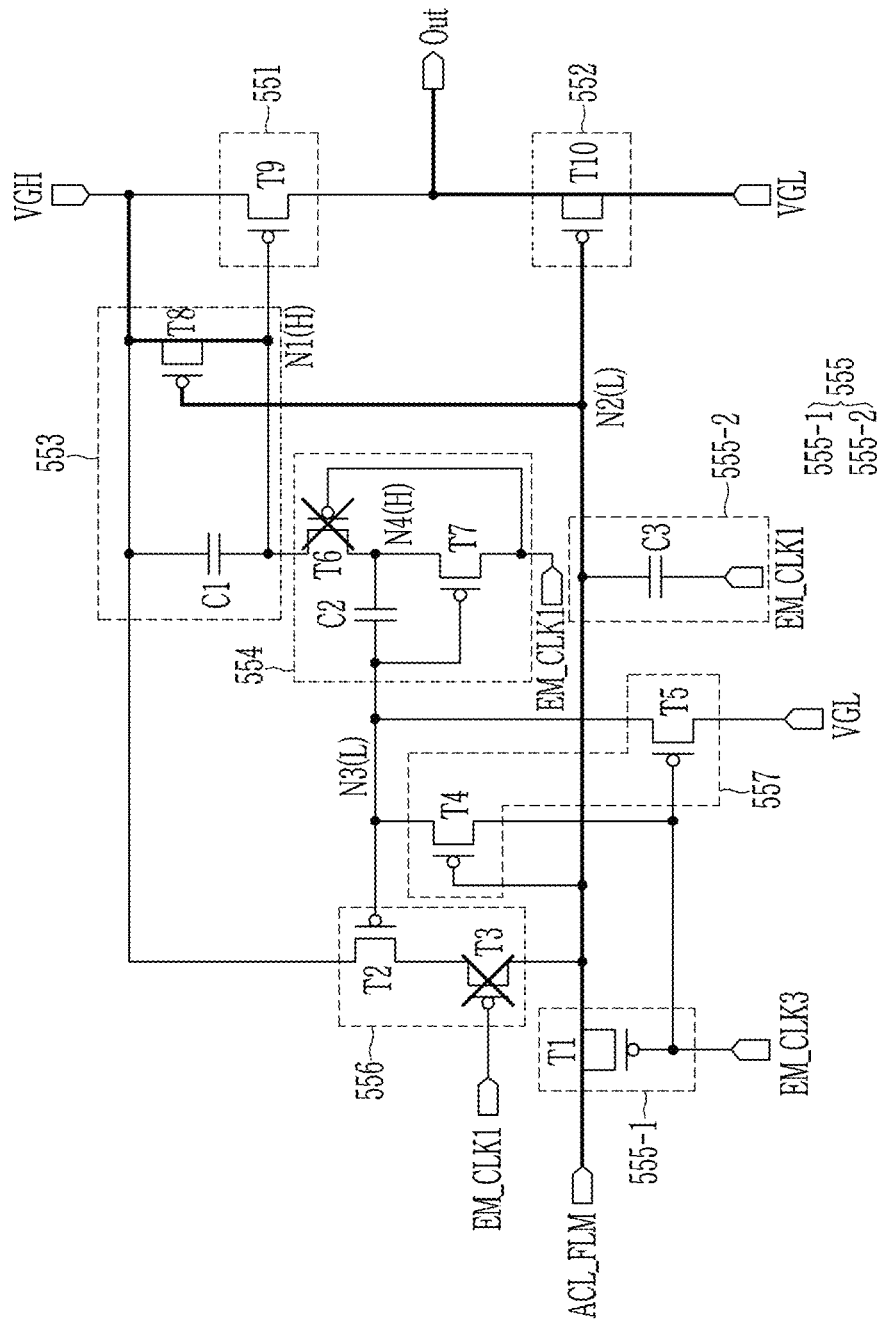
FIG. 5 to FIG. 10 are drawings provided for description of the operation of the stage of FIG. 3.

First, referring to FIG. 5, operation of the light emission signal stage EM at the section (a) will be described.

In the section (a), the control signal FLM is applied with a low voltage, the first clock signal EM_CLK1 is applied with a high voltage to the first clock input terminal In1, and the third clock signal EM_CLK3 with a low voltage is applied to the second clock input terminal In2.

Due to the first clock signal EM_CLK1 having the high voltage, the third transistor T3 and the sixth transistor T6 are turned off, and the first transistor T1 and the fifth transistor T5 are turned on by the third clock signal EM_CLK3 of the low voltage. The control signal FLM of the low voltage is applied to the second node N2 through the first transistor T1 such that the low voltage of the second node N2 is stored in the third capacitor C3. The tenth transistor T10 is turned on by the low voltage of the second node N2 and thus the low voltage VGL is output to the output terminal Out. In addition, the eighth transistor T8 is turned on by the low voltage of the second node N2 and thus the first node N1 becomes a high voltage VGH, and both ends of the first capacitor C1 become the high voltage VGH. Thus, the ninth transistor T9 is turned off.

In addition, the fourth transistor T4 is turned on by the low voltage of the second node N2 and thus the third clock signal EM_CLK3 is applied with a low voltage such that a voltage of the third node N3 is applied as a low voltage. In addition, the low voltage VGL is applied also through the fifth transistor T5.

The seventh transistor T7 is turned on by the low voltage VGL of the third node N3, and the first clock signal EM_CLK1 of the high voltage is applied to the fourth node N4. Thus, the high voltage (the fourth node N4) and the low voltage (the third node N3) are applied to opposite ends of the second capacitor C2.

In addition, the second transistor T2 is turned on by the low voltage VGL of the third node N3, but the third transistor T3 is turned off and thus the high voltage VGH is not transmitted to the second node N2 and is transmitted only to the input electrode of the third transistor T3.

That is, in the section (a), the first node N1 is applied with a high voltage H, the second node N2 is applied with a low voltage L, the third node N3 is applied with a low voltage L, and the fourth node N4 is applied with a high voltage H, and as the main operation, the tenth transistor T10 is turned on due to the low voltage L of the second node N2 and thus the low voltage VGL is applied to the output terminal Out. In this case, the pixel PX receiving a light emission signal is in a light emission section during which the pixel PX emits light.

Figure 6:
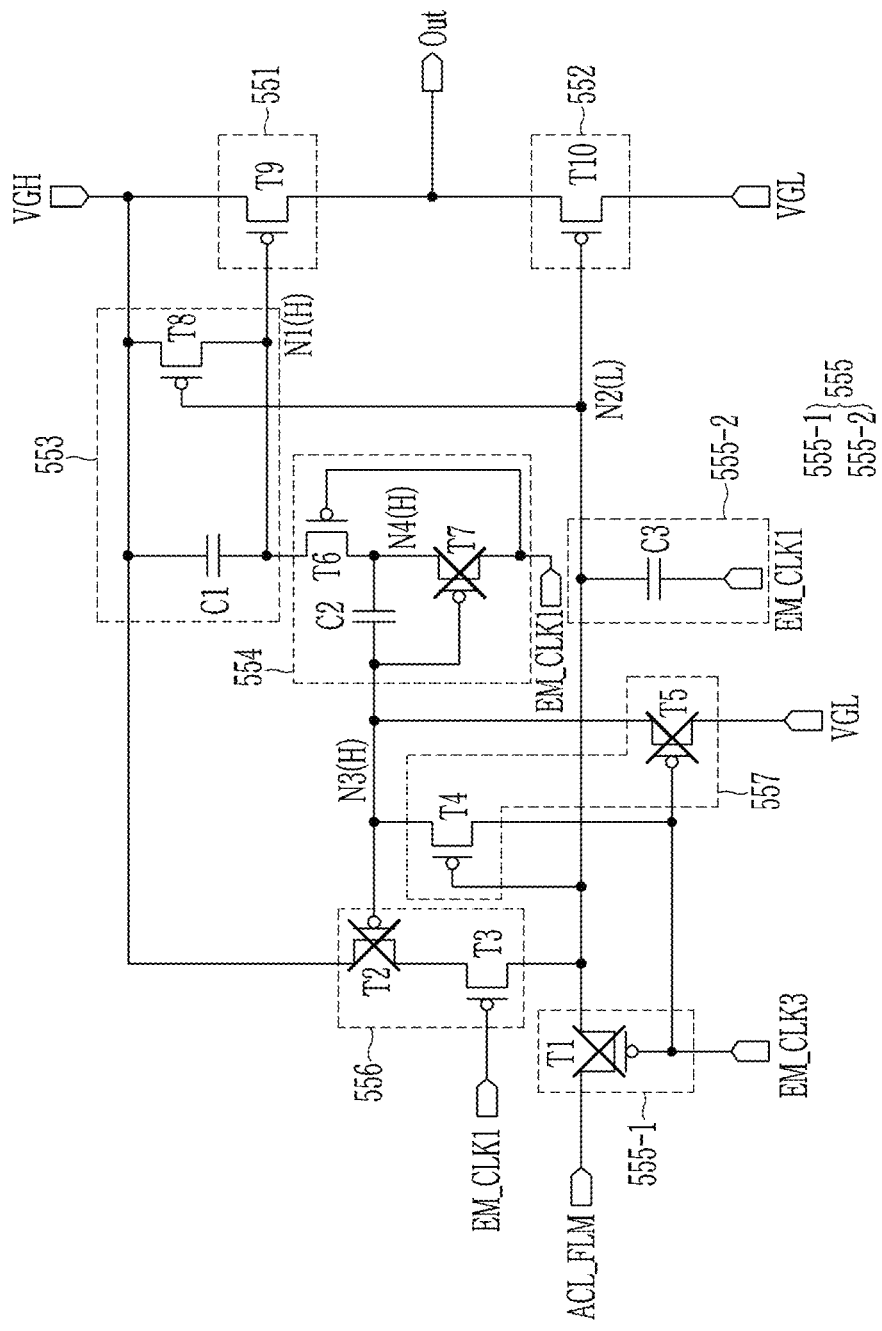

Next, referring to FIG. 6, operation of the light emission signal stage in the section (b) will be described.

In the section (b), the control signal FLM maintains a low voltage, the first clock signal EM_CLK1 changed to a low voltage is applied to the first clock input terminal In1, and the third clock signal EM_CLK3 changed to a high voltage is applied to the second clock input terminal In2.

The third transistor T3 and the sixth transistor T6 are turned on by the first clock signal EM_CLK1 of the low voltage, and the first transistor T1 and the fifth transistor T5 are turned off by the third clock signal EM_CLK3 of the high voltage. Because the first transistor T1 is in the turned-off state, the low voltage stored in the third capacitor C3 is maintained and the voltage of the second node N2 has a low voltage value. Accordingly, the tenth transistor T10 is turned on and thus the low voltage VGL is output to the output terminal Out.

In addition, the eighth transistor T8 is also turned on by the low voltage of the second node N2 and thus the first node N1 becomes the high voltage VGH, the ninth transistor T9 maintains the turned-off state, and the opposite ends of the first capacitor C1 become the high voltage VGH.

In addition, the fourth transistor T4 is also turned on by the low voltage of the second node N2 and thus the third clock signal EM_CLK3 of the high voltage is applied to the third node N3 such that the voltage of the third node N3 is changed to a high voltage value. In this case, because the fifth transistor T5 is in the turned-off state, the voltage of the third node N3 is changed to the high voltage due to the input of the fourth transistor T4 without changing the voltage of the third node N3.

The seventh transistor T7 is turned off due to the high voltage of the third node N3, and the sixth transistor T6 is turned on due to the first clock signal EM_CLK1 of the low voltage such that the first node N1 and the fourth node N4 are connected to each other. In this case, the voltage of the third node N3 connected with the second capacitor C2 is changed to the high voltage from the low voltage, and thus the voltage of the fourth node N4 and the voltage of the first node N1 connected to the fourth node N4 are boosted up. Accordingly, the voltage of the first node N1 may have a higher voltage value than the high voltage VGH.

Meanwhile, the second transistor T2 maintains the turned-off state due to the high voltage of the third node N3, and the third transistor T3 is turned on by the first clock signal EM_CLK1 of the low voltage. In this case, the high voltage VGH transmitted to the input electrode of the third transistor T3 through the second transistor T2 in the section (a) may be transmitted to the second node N2 as the third transistor T3 is turned on in the section (b). Accordingly, undesired voltage drops at the second node N2 can be prevented or reduced. That is, the first clock signal EM_CLK1 is applied at one end of the third capacitor C3, but the first clock signal EM_CLK1 is changed to a low voltage from a high voltage in the section (b), and thus the voltage of the second node N2 may be dropped. However, the voltage of the second node N2 can be maintained by the high voltage VGH applied through the second node_second controller 556. Further, capacitance of the third capacitor C3 is increased to maintain the voltage of the second node N2 to be constant in spite of a swing of a voltage level of the first clock signal EM_CLK1.

That is, in the section (b), the first node N1 and the fourth node N4 are applied with the boosted-up high voltage H, the second node N2 is applied with the low voltage L, and the third node n3 is applied with the high voltage H, and as a main operation, the tenth transistor T10 is turned on by the low voltage of the second node N2 such that the low voltage VGL is continuously applied to the output terminal Out. In this case also, the pixel PX receiving the light emission signal is in a light emission section such that the pixel PX emits light.

Comparing the section (a) and the section (b), the clock signal is inverted and applied, but the voltage of the first node N1 is maintained at a high voltage, the voltage of the second node N2 is maintained at a low voltage, and the low voltage VGL is continuously output to the output terminal out.

Figure 7:
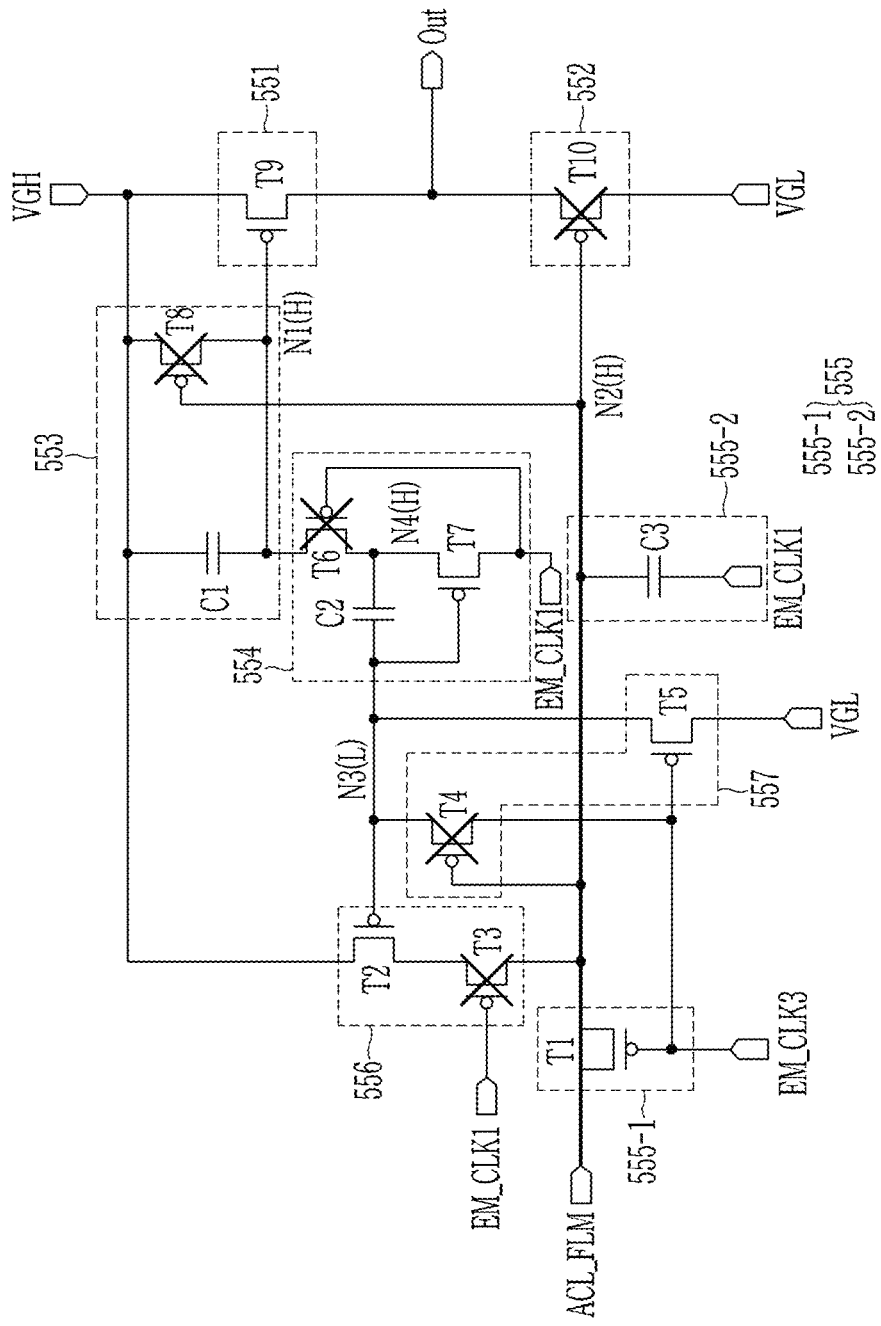

Next, referring to FIG. 7, the operation of the light emission signal stage in the section (c) will be described.

In the section (c), the control signal FLM is changed to a high voltage, the first clock signal EM_CLK1 changed to a high voltage is applied to the first clock input terminal In1, and the third clock signal EM_CLK3 changed to a low voltage is applied to the second clock input terminal In2.

The third transistor T3 and the sixth transistor T6 are turned off by the first clock signal EM_CLK1 of the high voltage, and the first transistor T1 and the fifth transistor T5 are turned on by the third clock signal EM_CLK3 of the low voltage. The control signal FLM of the high voltage is applied to the second node N2 through the first transistor T1 such that the voltage of the second node N2 is changed to a high voltage and then stored in the third capacitor C3. The tenth transistor T10 is turned off by the high voltage of the second node N2. In addition, the eighth transistor T8 is turned off by the high voltage of the second node N2.

Meanwhile, because the fifth transistor T5 is turned on, the low voltage VGL is applied to the third node N3. In this case, the fourth transistor T4 is turned off because the second node N2 has the high voltage. Thus, the voltage of the third node N3 is controlled by the fifth transistor T5, and is changed to the low voltage VGL.

The second transistor T2 and the seventh transistor T7 are turned on due to the low voltage of the third node N3. The seventh transistor T7 is turned on and thus the fourth node N4 is applied with the first clock signal EM_CLK1 of the high voltage. Thus, the high voltage (fourth node N4) and the low voltage (third node N3) are applied to respective ends of the second capacitor C2. In addition, the second transistor T2 is turned on but the third transistor T3 is turned off such that the high voltage VGH is transmitted only to the input electrode of the third transistor T3 and the high voltage VGH is not transmitted to the second node N2.

Because the sixth transistor T6 and eighth transistor T8 are turned off, the voltage of the first node N1 in the section (b) is maintained, thereby maintaining a high voltage state.

That is, in section (c), the first node N1 is applied with the high voltage H, the second node N2 is applied with the high voltage H, the third node N3 is applied with the low voltage L, and the fourth node N4 is applied with the high voltage H, and the tenth transistor T10 and the ninth transistor T9 are both in the turned-off state, so no voltage may be output to the output terminal Out. For example, the low voltage VGL is output until the voltage of the second node N2 becomes a turn-off voltage of the tenth transistor T10, and when the tenth transistor T10 are turned off, the output voltage is gradually increased.

Figure 8:
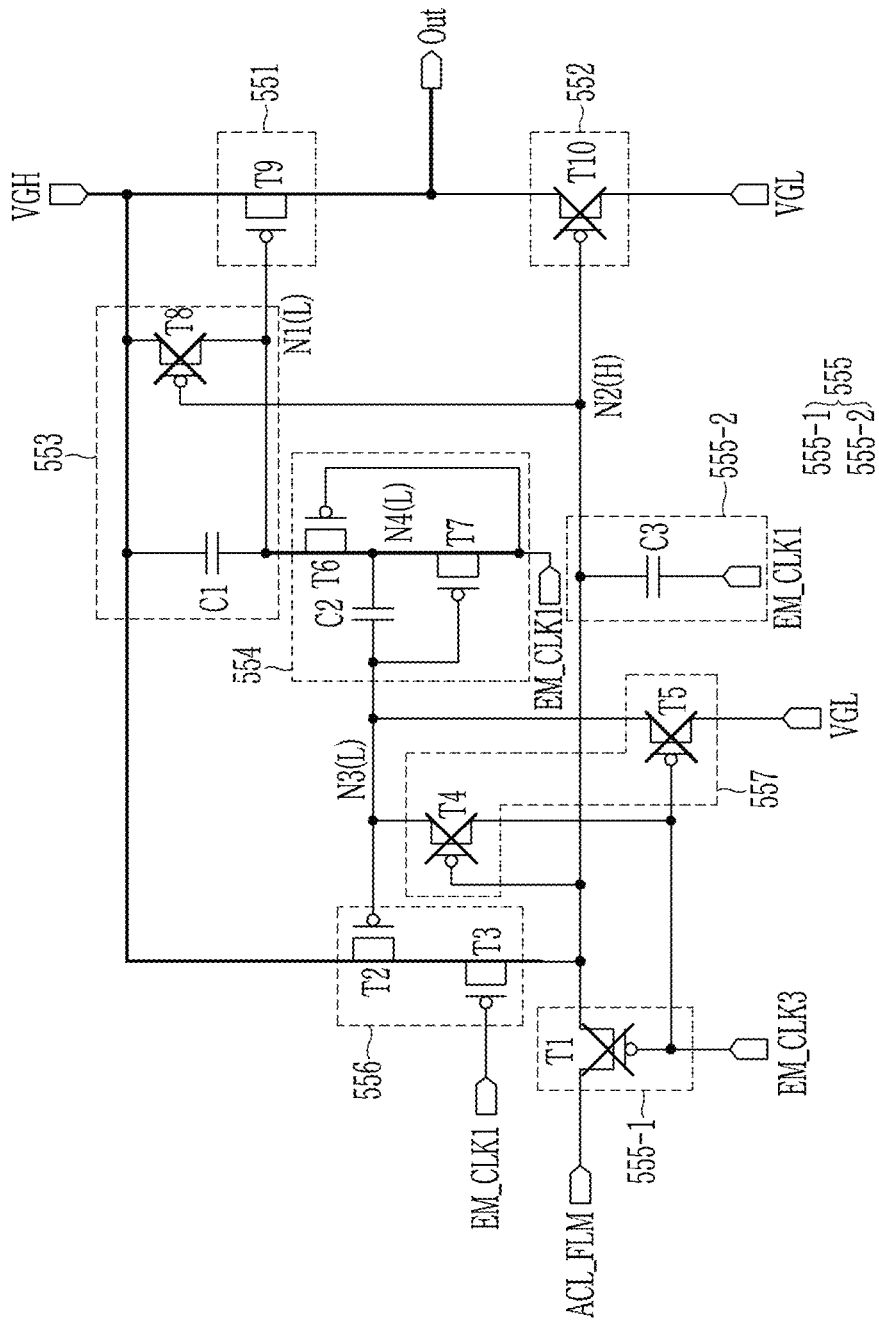

Next, referring to FIG. 8, the operation of the light emission signal stage in the section (d) will be described.

In the section (d), the control signal FLM is maintained with the high voltage, the first clock signal EM_CLK1 is changed to the low voltage and then applied to the first clock input terminal In1, and the third clock signal EM_CLK3 is changed to the high voltage and then applied to the second clock input terminal In2.

The third transistor T3 and the sixth transistor T6 are turned on by the first clock signal EM_CLK1 of the low voltage, and the first transistor T1 and the fifth transistor T5 are turned off by the third clock signal EM_CLK3 of the high voltage.

Because the first transistor T1 is in the turned-off state, the high voltage stored in the third capacitor C3 is maintained such that the voltage at the second node N2 has a high voltage value. Accordingly, the tenth transistor T10 maintains the turned-off state. In addition, the eighth transistor T8 and the fourth transistor T4 also maintain the turned-off state due to the high voltage of the second node N2.

The fifth transistor T5 is turned off by the third clock signal EM_CLK3 of the high voltage. Because the fourth transistor T4 and the fifth transistor T5 are both turned off, the voltage at the third node N3 is not changed and is maintained with the low voltage, which is the voltage at the third node N3 in the section (c).

The seventh transistor T7 maintains the turned-off state due to the low-voltage of the third node N3, and the sixth transistor T6 is turned on by the first clock signal EM_CLK1 of the low voltage such that the first node N1, the fourth node N4, and the first clock signal EM_CLK1 of the low voltage are connected with each other. Accordingly, the voltage at the first node N1 and the voltage at the fourth node N4 are changed to the low voltage. The ninth transistor T9 is turned on by the first node N1 of the low voltage, and accordingly, the high voltage VGH is output to the output terminal Out.

Meanwhile, the second transistor T2 is turned on by the low voltage of the third node N3 and the third transistor T3 is also turned on by the first clock signal EM_CLK1 of the low voltage, and thus the high voltage VGH terminal is connected with the second node N2. Accordingly, the voltage of the second node N2 is maintained with the high voltage VGH such that the tenth transistor T10 cannot be turned on.

That is, in the section (d), the first node N1 and the fourth node N4 are applied with the low voltage L, the second node N2 is applied with the high voltage H, and the third node N3 is applied with the low voltage L, and as a main operation, the ninth transistor T9 is turned on by the low voltage of the first node N1 such that the high voltage VGH is output to the output terminal Out. In this case, a pixel PX receiving a light emission signal is in a writing section during which a data voltage is stored in a capacitor in the pixel PX.

Figure 9:
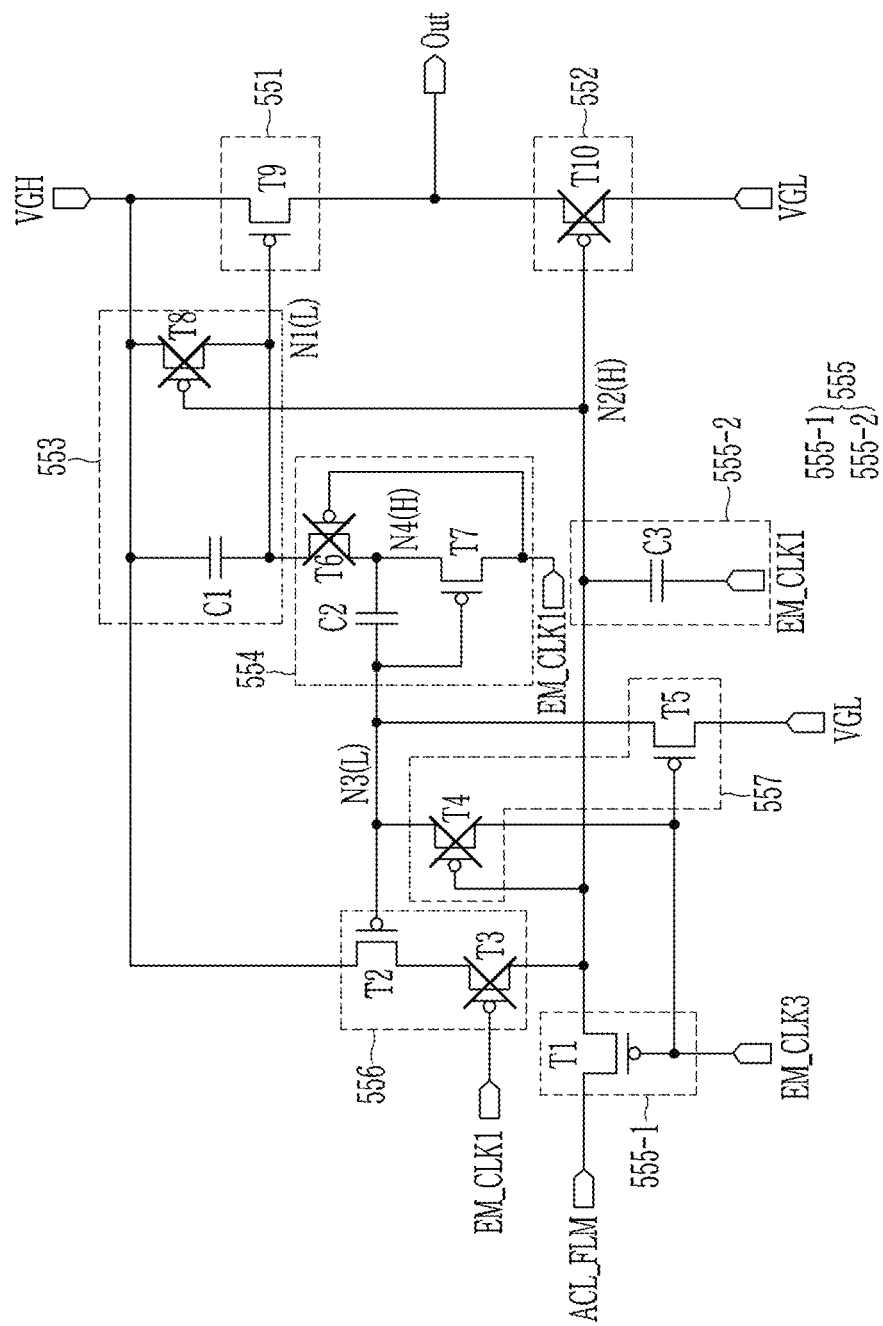

Next, referring to FIG. 9, the operation of the light emission signal stage in the section (e) will be described.

In the section (e), the control signal FLM maintains the high voltage, the first clock signal EM_CLK1 is changed to the high voltage and then applied to the first clock input terminal In1, and the third clock signal EM_CLK3 is changed to the low voltage and then applied to the second clock input terminal In2.

The third transistor T3 and the sixth transistor T6 are turned off due to the first clock signal EM_CLK1 of the high voltage, and the first transistor T1 and the fifth transistor T5 are turned off due to the third clock signal EM_CLK3 of the low voltage.

The control signal FLM of the high voltage is applied to the second node N2 through the first transistor T1 such that the voltage of the second node N2 is maintained with the high voltage. The tenth transistor T10 is turned off due to the high voltage of the second node N2. In addition, the eighth transistor T8 and the fourth transistor T4 also maintain the turned-off state due to the high voltage of the second node N2.

The fifth transistor T5 is turned on and thus the low voltage VGL is applied to the third node N3. In this case, because the fourth transistor T4 is turned off, the fourth transistor T4 cannot change the voltage of the third node N3.

The third node N3 has the low voltage VGL and thus the second transistor T2 and the seventh transistor T7 are turned on. The seventh transistor T7 is turned on and thus the first clock signal EM_CLK1 of the high voltage is applied to the fourth node N4. Thus, the opposite ends of the second capacitor C2 are respectively applied with the high voltage (the fourth node N4) and the low voltage (the third node N3).

In addition, the second transistor T2 is turned on but the third transistor T3 is turned off and thus the high voltage VGH is transmitted only to the input electrode of the third transistor T3 and is not transmitted to the second node N2.

Because the sixth transistor T6 is turned off by the first clock signal EM_CLK1 of the high voltage, the voltage stored in the first capacitor C1 is not changed and the voltage of the first node N1 is maintained with the low voltage. Thus, the ninth transistor T9 is turned on and the high voltage VGH is continuously output to the output terminal Out.

That is, in the section (e), the first node N1 is applied with the low voltage L, the second node N2 is also applied with the high voltage H, the third node N3 is applied with the low voltage L, and the fourth node N4 is applied with the high voltage H, and the ninth transistor T9 maintains the turned-on state such that the high voltage VGH is output to the output terminal Out.

Comparing the section (d) and the section (e), the clock signal is inverted and then applied, but the voltage of the first node N1 is maintained with the low voltage such that the high voltage VGH is continuously output to the output terminal Out. In addition, the voltage of the second node N2 is maintained with the high voltage such that the low voltage VGL is not transmitted to the output terminal Out.

Figure 10:
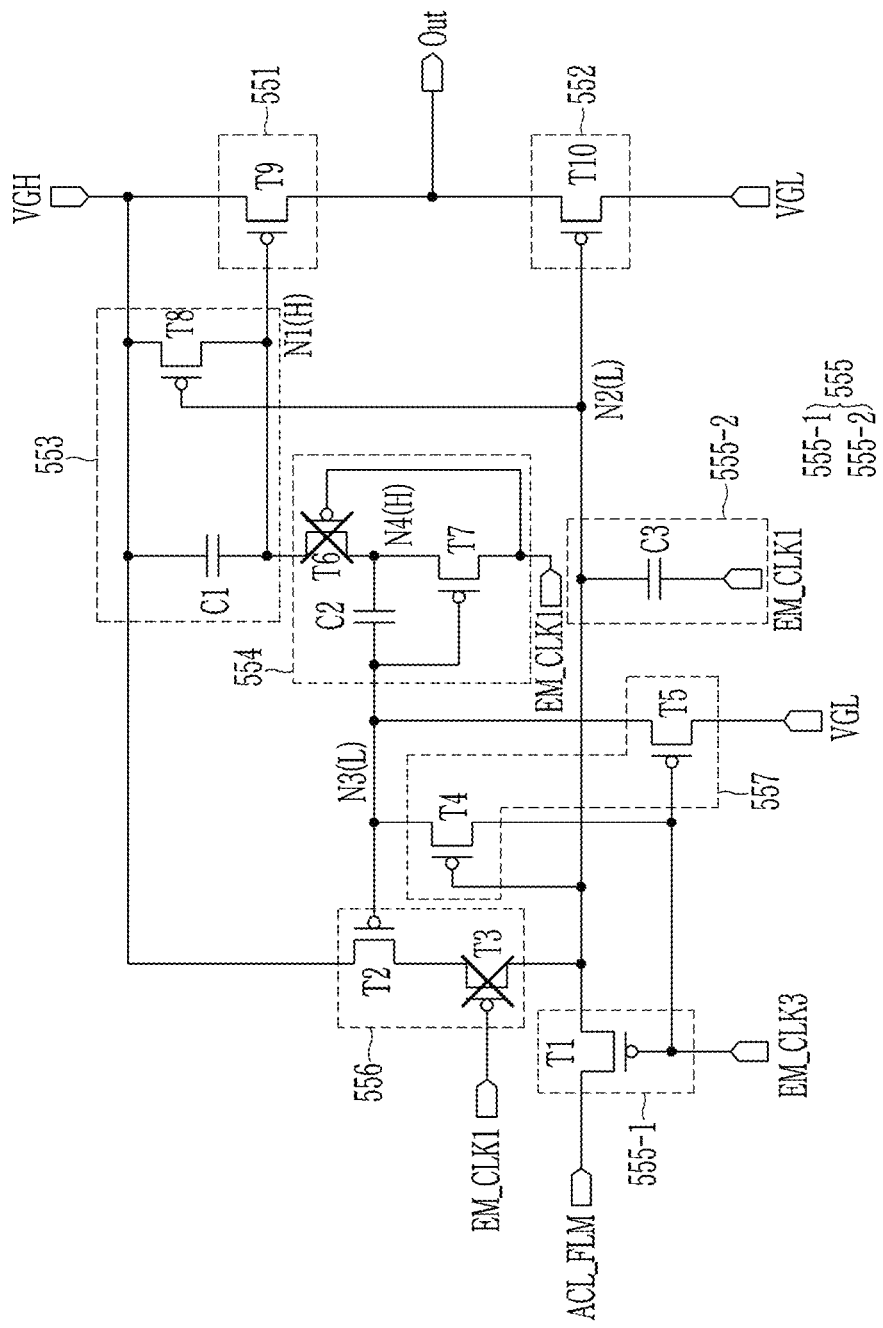

Next, referring to FIG. 10, the operation of the light emission signal stage in the section (f) will be described.

In the section (f), the control signal FLM is changed to a low voltage, the first clock signal EM_CLK1 is changed to the high voltage and applied to the first clock input terminal In1, and the third clock signal EM_CLK3 is changed to the low voltage and then applied to the second clock input terminal In2.

In addition, the section (f) is applied after a section that is in the same state as the section (d). Therefore, it will be described as a section that is applied next to the section (d).

The third transistor T3 and the sixth transistor T6 are turned off by the first clock signal EM_CLK1 of the high voltage, and the first transistor T1 and the fifth transistor T5 are turned on by the third clock signal EM_CLK3 of the low voltage.

A control signal of the low voltage is applied to the second node N2 through the first transistor T1 such that the voltage of the second node N2 is changed to the low voltage, and the tenth transistor T10 is turned on. Thus, the low voltage VGL starts to output to the output terminal Out. The eighth transistor T8 and the fourth transistor T4 are also in the turned-off state due to the low voltage of the second node N2.

Because the eighth transistor T8 is turned on, the high voltage VGH is applied to the first node N1, and the ninth transistor T9 is turned off due to the high voltage of the first node N1 such that the high voltage VGH is no longer output to the output terminal Out.

As the fourth transistor T4 is turned on, the third clock signal EM_CLK3 of the low voltage is applied to the third node N3. In addition, the low voltage VGL is applied to the third node N3 through the turned-on fifth transistor T5. Thus, the third node N3 has a low voltage.

The second transistor T2 and the seventh transistor T7 are turned on due to the low voltage of the third node N3. The seventh transistor T7 is turned on and thus the first clock signal EM_CLK1 of the high voltage is applied to the fourth node N4. Thus, the high voltage (the fourth node N4) and the low voltage (the third node N3) are applied to the opposite ends of the second capacitor C2.

In addition, although the second transistor T2 is turned on, the third transistor T3 is turned off, and thus the high voltage VGH is transmitted only to the input electrode of the third transistor T3 and is not transmitted to the second node N2.

Because the sixth transistor T6 is turned off due to the first clock signal EM_CLK1 of the high voltage, the voltage of the first node N1 is not affected. Thus, the voltage of the first node N1 is controlled by the eighth transistor T8, and the high voltage VGH is transmitted through the eighth transistor T8 and maintains the high voltage.

That is, in the section (f), the first node N1 is applied with the high voltage H, the second node is applied with the low voltage L, the third node N3 is applied with the low voltage L, and the fourth node N4 is applied with the high voltage H, the ninth transistor T9 is turned off, and the tenth transistor T10 starts to be turned on such that the voltage of the output terminal Out is changed to the low voltage VGL from the high voltage VGH and then output.

After the section (f), a section corresponding to the section (b) is positioned, and thereafter iteratively operates as described above.

The light emission signal stage outputs a light emission signal that is delayed by a half clock period from the control signal. That is, because the carry signal applied to the light emission signal stage of the next stage is delayed by a half clock period, the application timing of the high voltage VGH among the output light emission signals is also sequentially output by delaying by a half clock period.

Figure 11:
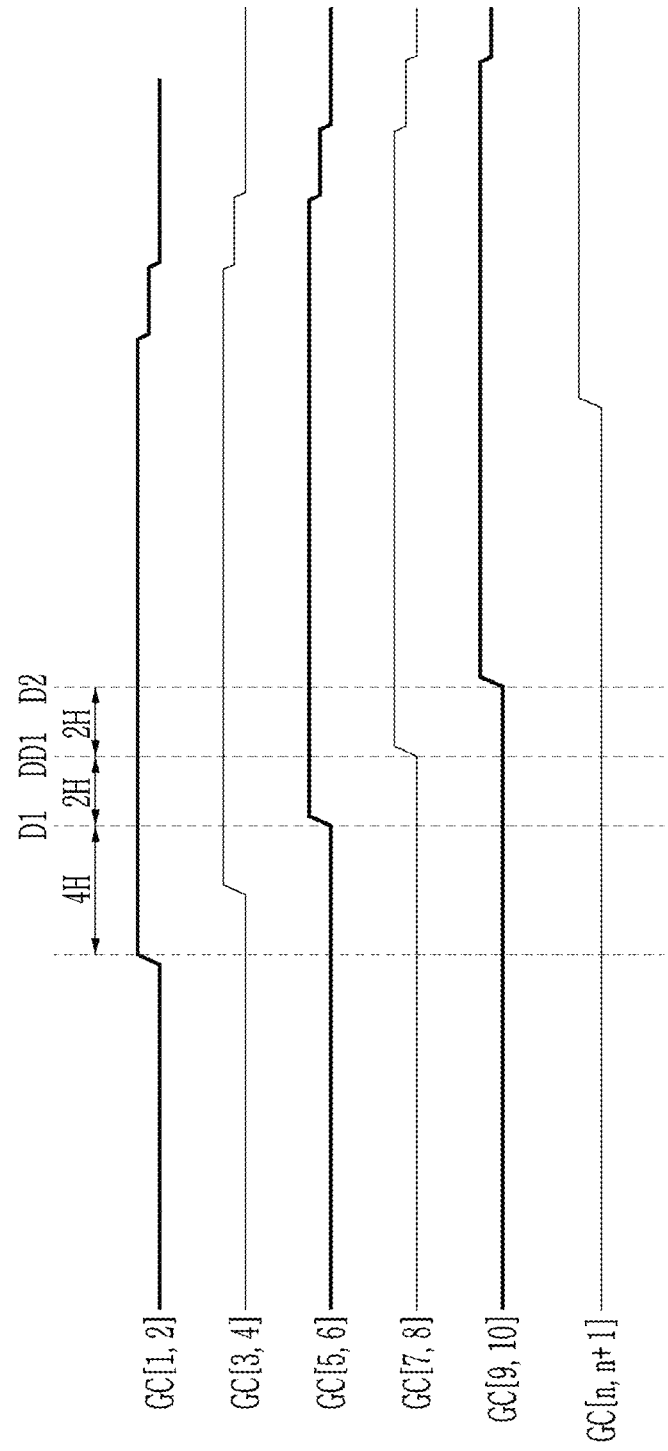
FIG. 11 is a waveform diagram of an output signal of the light emission signal generator according to some example embodiments.

Next, an output signal of the light emission signal stage according to some example embodiments will be described in detail with reference to FIG. 11. FIG. 11 is a waveform diagram of an output signal of the light emission signal generator according to some example embodiments.

Referring to FIG. 11, a first output signal GC[1,2] of the first light emission signal stage EM[1,2] maintains the high voltage VGH, and then after two horizontal periods 2H during which two pixel rows connected to the first light emission signal stage EM[1,2] are driven, a second output signal GC[3,4] of the second light emission signal stage EM[3,4] is changed to the high voltage VGH from the low voltage VGL. Subsequently, a third output signal GC[5,6] of the third light emission signal stage EM[5,6] is changed to the high voltage VGH from the low voltage VGL (refer to D1). Similarly, after two horizontal periods 2H, a fourth output signal GC[7,8] of the fourth light emission signal stage EM[7,8] is changed to the high voltage VGH from the low voltage VGL (refer to DD1), and then a fifth output signal GC[9,10] of the fifth light emission signal stage EM[9,10] is changed to the high voltage VGH from the low voltage VGL (refer to D2).

As previously described, the odd-numbered light emission signal stages such as the first light emission signal stage EM[1,2], the third light emission signal stage EM[5,6], and the fifth light emission signal stage EM[9,10] are connected with a first high voltage transmission line VGH1 and thus receive a high voltage from the first high voltage transmission line VGH1. In addition, the even-numbered light emission signal stages such as the second light emission signal stage EM[3,4] and the fourth light emission signal stage EM[7,8] are connected with a second high voltage transmission line VGH2 and thus receive a high voltage from the second high voltage transmission line VGH2.

Signal resistance of the first output signal GC[1,2] of the first light emission signal stage EM[1,2] that is connected to the first high voltage transmission line VGH1 and thus receives the high voltage from the first high voltage transmission line VGH1 may be increased when the high voltage is applied (D1) to the third light emission signal stage EM[5,6] that is connected to the first high voltage transmission line VGH1, which is the same high voltage transmission line, and interference may occur such that the magnitude of the high voltage VGH of the first output signal GC[1,2] of the first light emission signal stage EM[1,2] may be changed. Similarly, when the high voltage is applied to the fifth light emission signal stage EM[9,10] that is connected to the first high voltage transmission line VGH1 (D2), intensity of the first output signal GC[1,2] of the first light emission signal stage EM[1,2] connected to the first high voltage transmission line VGH1, which is the same high voltage transmission line, and intensity of the third output signal GC[5,6] of the third light emission signal stage EM[5,6] may be changed.

In addition, like the second light emission signal stage EM[3,4] and the fourth light emission signal stage EM[7,8], which are connected to the second high voltage transmission line VGH2 and receive the high voltage from the second high voltage transmission line VGH2, the second output signal GC[3,4] and the fourth output signal GC[7,8] of the even-numbered light emission signal stages may experience changes in intensity due to resistance of the second high voltage transmission line VGH2 and signal interference therebetween.

When the odd-numbered light emission signal stages, for example, the first light emission signal stage EM[1,2], the third light emission signal stage EM[5,6], and the fifth light emission signal stage EM[9,10], and the even-numbered light emission signal stages, for example, the second light emission signal stage EM[3,4] and the fourth light emission signal stage EM[7,8], are all connected to one same high voltage transmission line, a high voltage output value of the first light emission signal stage EM[1,2] may be changed when a high voltage is sequentially applied to the light emission signal stages of the next stages such as the second output signal GC[3,4] of the second light emission signal stage EM[3,4] and the third output signal GC[5,6] of the third light emission signal stage EM[5,6] for every two horizontal periods 2H. In addition, a high voltage value of the second output signal GC[3,4] of the second light emission signal stage EM[3,4] may also be changed when a high voltage is sequentially applied to the light emission signal stages at the next stages for every two horizontal periods 2H.

That is, sequentially, whenever the high voltage is applied to the stage for the light emission signal of the next stage for every two horizontal periods 2H, the high voltage value input to and output from the stage for the light emission signal stage of the previous stage can be changed.

However, in the organic light emitting diode (OLED) display according to some example embodiments, the odd-numbered light emission signal stages such as the first light emission signal stage EM[1,2], the third light emission signal stage EM[5,6], and the fifth light emission signal stage EM[9,10] are connected to the first high voltage transmission line VGH1 and thus receive a high voltage from the first high voltage transmission line VGH1, and the even-numbered light emission signal stages such as the second light emission signal stage EM[3,4] and the fourth light emission signal stage EM[7,8] are connected to the second high voltage transmission line VGH2 and thus receive a high voltage from the second high voltage transmission line VGH2.

As such, the odd-numbered light emission signal stages and the even-numbered light emission signal stages are connected to different high voltage transmission lines, and thus the magnitude of the high voltage input to the even-numbered light emission signal stages and the magnitude of the high voltage input to the odd-numbered light emission signal stages may not be affected by each other.

Therefore, it is possible to reduce the change in magnitude of the high voltage applied to and output from the light emission signal stage by signal interference between the high voltage input to the odd-numbered light emission signal stage and the high voltage input to the even-numbered light emission signal stage. In addition, the magnitude of the high voltage of the light emission signal stage of the previous stage of the light emission signal stage connected to the same first high voltage transmission line VGH1 can be changed whenever a high voltage is applied to the next stage of the light emission signal stage in every a longer period than two horizontal periods 2H, for example, every four horizontal periods 4H.

Figure 12:
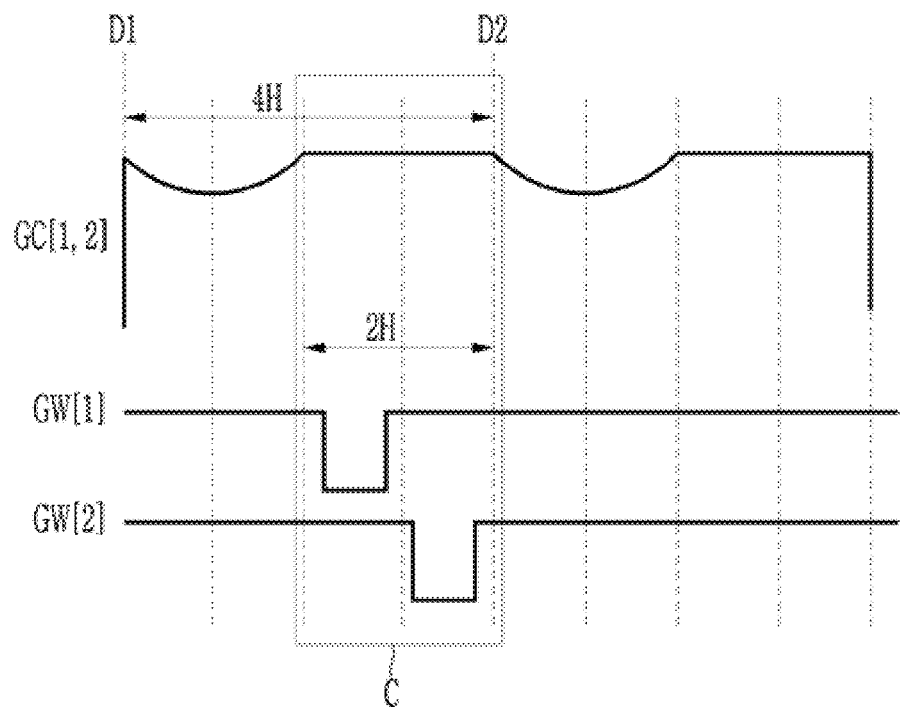
FIG. 12 is a waveform diagram of some signals of a light emission signal generator according to some example embodiments.

Next, referring to FIG. 11 and FIG. 12, a gate signal of an organic light emitting diode display according to another embodiment will be described. FIG. 12 is a waveform diagram of some signals of a light emission signal generator according to some example embodiments.

As previously described, in the organic light emitting diode display according to some example embodiments, the odd-numbered light emission signal stages and the even-numbered light emission signal stages are connected to different high voltage transmission lines, and thus the magnitude of the high voltage input to the even-numbered light emission signal stages and the magnitude of the high voltage input to the odd-numbered light emission signal stages may not be affected by each other.

Therefore, it is possible to reduce the change in magnitude of the high voltage applied to and output from the light emission signal stage by signal interference between the high voltage input to the odd-numbered light emission signal stage and the high voltage input to the even-numbered light emission signal stage. In addition, the magnitude of the high voltage of the light emission signal stage of the previous stage of the light emission signal stage connected to the same first high voltage transmission line VGH1 can be changed whenever a high voltage is applied to the next stage of the light emission signal stage in every a longer period than two horizontal periods 2H, for example, every four horizontal periods 4H.

As in the first position D1 and the second position D2 shown in FIG. 12, the magnitude of a high voltage of a light emission signal stage of the previous stage of a light emission signal stage connected to the first high voltage transmission line VGH1 may be changed when a high voltage is applied to a light emission signal stage of the next stage for every four horizontal periods 4H. In this case, referring to the portion marked by C in FIG. 12, the previous stage scan signal GW can be input during the next two horizontal periods 2H of the periods between the first position D1 and the second position D2 in which the magnitude of the high voltage of the stage for the light emission signal changes. The previous stage scan signal GW can be input while the magnitude of the high voltage does not change, whereby the change of the magnitude of the high voltage of the light emission signal stage of the previous stage can be prevented from affecting the high voltage magnitude of the next light emission signal stage by adjusting the input time of the previous stage scan signal GW, and thus it may not affect intensity of light emission of two pixel rows connected to the light emission signal stage of the next stage.

Figure 13:
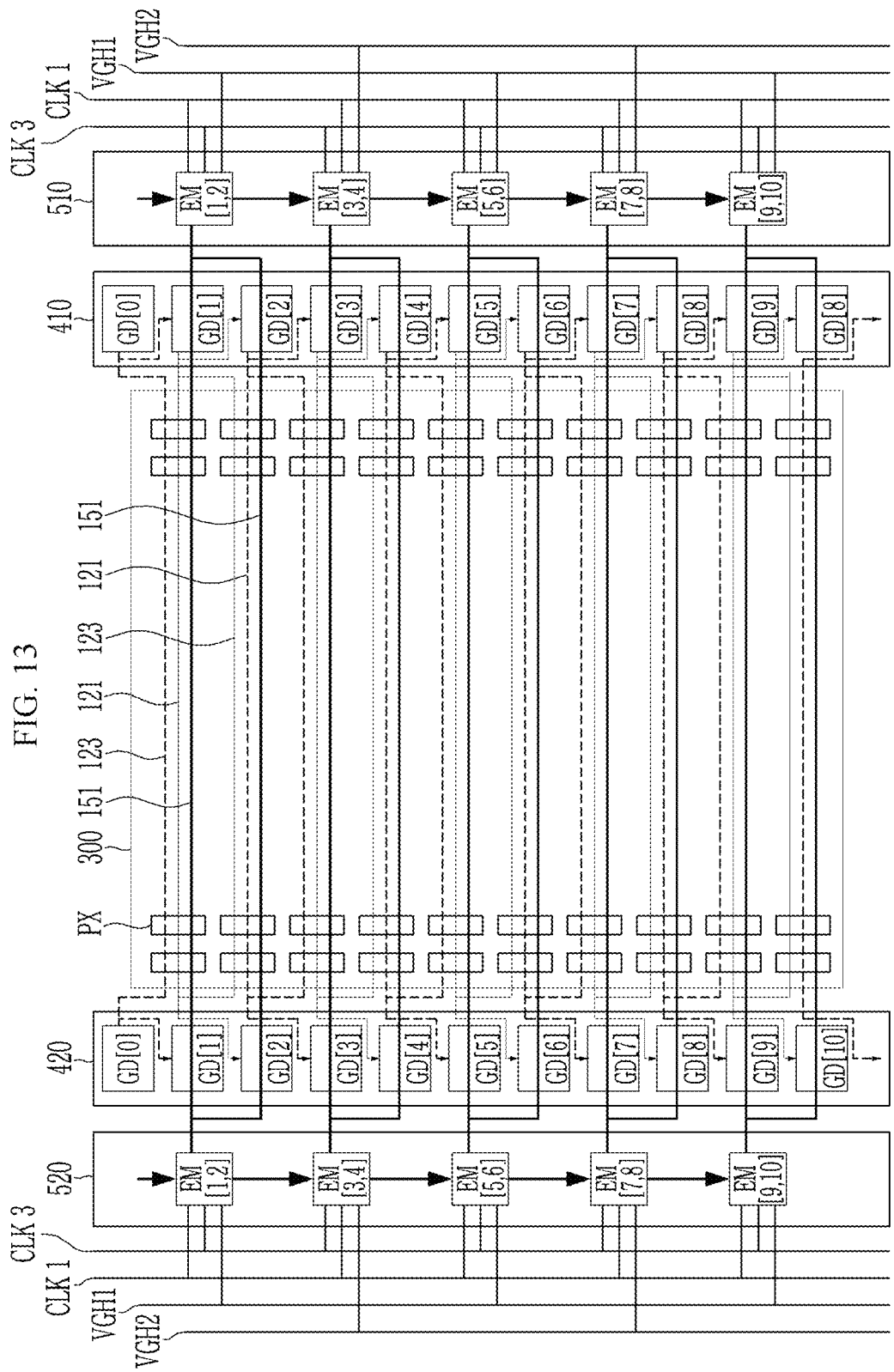
FIG. 13 is a block diagram of an organic light emitting diode display according to some example embodiments.

Next, an organic light emitting diode display according to some example embodiments will be described in more detail. FIG. 13 is a block diagram of an organic light emitting diode display according to some example embodiments.

Referring to FIG. 13, an organic light emitting diode display according to some example embodiments is similar to the organic light emitting diode display according to the example embodiments illustrated and described with respect to FIG. 1 to FIG. 3. Thus, some detailed description of similar constituent elements may be omitted.

Referring to FIG. 13, unlike the organic light emitting diode display according to some example embodiments illustrated and described with respect to FIG. 1 to FIG. 3, in the organic light emitting diode display according to some example embodiments, scan signal generators 410 and 420, light emission signal generators 510 and 520, first clock signal transmission lines CLK1, third clock signal transmission lines CLK3, first high voltage transmission lines VGH1, and second high voltage transmission lines VGH2 are respectively located at opposite sides of a display area 300. The two first clock signal transmission lines CLK1 located at the opposite sides of the display area 30 can be connected with each other, and the two second high voltage transmission line VGH2 located at the opposite sides of the display area 300 can be connected with each other.

For example, the first scan signal generator 410 and the first light emission signal generator 510 are located at the right side of the display area 300, and the second scan signal generator 420 and the second light emission signal generator 520 are located at the left side of the display area 30.

The first scan signal generator 410 and the second scan signal generator 420 are connected to the same signal line, and include a plurality of same scan signal stages GD. In addition, the first light emission signal generator 510 and the second light emission signal generator 520 are connected to the same signal line, and include a plurality of the same light emission signal stages EM.

As described, the first scan signal generator 410 and the second scan signal generator 420, and the first light emission signal generator 510 and the second light emission signal generator 520, of similar structures, are positioned on respective sides of the display area 300, and thus signal delay of a plurality of pixels PX located in the same pixel row can be prevented.

In addition, as in the organic light emitting diode display of the previously described example embodiment, in the organic light emitting diode display according to some example embodiments, odd-numbered light emission signal stages are connected to the first high voltage transmission line VGH1 and thus receive a high voltage, and even-numbered light emission signal stages are connected to the second high voltage transmission line VGH2 and thus receive a high voltage from the second high voltage transmission line VGH2.

As such, the odd-numbered light emission signal stages and the even-numbered light emission signal stages are connected to different high voltage transmission lines, thereby reducing a change of the magnitude of the applied high voltage due to signal interference between adjacent light emission signal stages.

In addition, while the high voltage magnitude does not change, the previous stage scan signal GW can be input, whereby the effect of the change in the high voltage magnitude of the light emission signal stage in the previous stage can be prevented from affecting the magnitude of the high voltage of the next light emission signal stage.

While embodiments according to the present disclosure have been described in connection with what is presently considered to be practical example embodiments, it is to be understood that embodiments according to the present invention are not limited to the disclosed embodiments. On the contrary, it is intended to cover various modifications and equivalent arrangements included within the spirit and scope of the appended claims and their equivalents.

| Description of Some of the Reference Symbols | |
|---|---|
| 300: display area | 410, 420: scan signal generator |
| 510, 520: light emission signal generator | 121: scan line |
| 123: previous stage scan line | 151: light emission signal line |
| 171, 172, 171-1, 172-1: clock signal wire | |
| 551: high level output portion | 552: low level output portion |
| 553: first node first controller | 554: first node_second controller |
| 555: second node_first controller | |
| 555-1: first second node_first controller | |
| 555-2: second second node_first controller | |
| 556: second node_second controller | |
| 557: third node controller | EM: light emission signal stage |
| GD: scan signal stage | GI: scan signal |
| GW: previous stage scan signal | FLM: control signal |
| In1, In2: clock input terminal | Out: output terminal |
| CLK1, CLK3: clock signal transmission line | |
| VGH1, VGH2: high voltage transmission line | |

What is claimed is:

1. An organic light emitting diode (OLED) display comprising:
a display area comprising a plurality of pixel rows configured to emit light in response to a light emission signal;
a light emission signal generator at a periphery of the display area, and including a plurality of light emission signal stages connected to the plurality of pixel rows; and
a first high voltage transmission line and a second high voltage transmission line connected to the light emission signal generator,
wherein the first high voltage transmission line is connected to a plurality of odd-numbered light emission signal stages among the plurality of light emission signal stages and the odd-numbered light emission signal stages are configured to sequentially receive a first high voltage from the first high voltage transmission line with a plurality of horizontal periods difference, and
the second high voltage transmission line is connected to a plurality of even-numbered light emission signal stages among the plurality of light emission signal stages and the odd-numbered light emission signal stages are configured to sequentially receive a second high voltage from the second high voltage transmission line with the plurality of horizontal periods difference.

2. The OLED display of claim 1, wherein the first high voltage transmission line and the second high voltage transmission line are insulated from each other.

3. The OLED display of claim 2, wherein the plurality of light emission signal stages are sequentially arranged, and include a first light emission signal stage, a second light emission signal stage, a third light emission signal stage, a fourth light emission signal stage, and a fifth light emission signal stage to which a high voltage is sequentially applied,
the first light emission signal stage, the third light emission signal stage, and the fifth light emission signal stage are configured to receive the first high voltage from the first high voltage transmission line, and the second light emission signal stage and the fourth light emission signal stage are configured to receive the second high voltage from the second high voltage transmission line.

4. The OLED display of claim 3, wherein the first light emission signal stage, the third light emission signal stage, and the fifth light emission signal stage are configured to sequentially receive the first high voltage with a four horizontal period difference, and
the second light emission signal stage and the fourth light emission signal stage are configured to sequentially receive the second high voltage with a four horizontal period difference.

5. The OLED display of claim 4, further comprising a scan signal generator between the display area and the light emission signal generator.

6. The OLED display of claim 5, wherein a previous stage scan signal is applied during latter two horizontal periods of the four horizontal periods.

7. The OLED display of claim 6, wherein each of the plurality of light emission signal stages comprises a first clock input terminal and a second clock input terminal configured to receive two clock signals, a control terminal configured to receive the light emission signal from a light emission signal stage of the previous stage, and an output terminal configured to output the light emission signal,
each of the plurality of light emission signal stages includes a high-level output portion and a low-level output portion, and
the high-level output portion is configured to output a high voltage to the output terminal and the low-level output portion is configured to output a low voltage to the output terminal.

8. The OLED display of claim 1, wherein the plurality of light emission signal stages are connected to two pixel rows among the plurality of pixel rows and apply a light emission signal to the plurality of pixel rows.

9. The OLED display of claim 8, wherein the plurality of pixel rows comprise a first pixel row, a second pixel row, a third pixel row, a fourth pixel row, a fifth pixel row, a sixth pixel row, a seventh pixel row, and an eighth pixel row that are sequentially arranged,
the plurality of light emission signal stages comprise a first light emission signal stage, a second light emission signal stage, a third light emission signal stage, and a fourth light emission signal stage that are sequentially arranged, the first light emission signal stage is connected to the first pixel row and the second pixel row, the second light emission signal stage is connected to the third pixel row and the fourth pixel row, the third light emission signal stage is connected to the fifth pixel row and the sixth pixel row, the fourth light emission signal stage is connected to the seventh pixel row and the eighth pixel row, the first light emission signal stage and the third light emission signal stage are configured to receive the first high voltage through the first high voltage transmission line, and the second light emission signal stage and the fourth light emission signal stage are configured to receive the second high voltage through the second high voltage transmission line.

10. The OLED display of claim 9, wherein
the first light emission signal stage and the third light emission signal stage are configured to sequentially receive the first high voltage with a four horizontal period difference, and the second light emission signal stage and the fourth light emission signal stage are configured to sequentially receive the second high voltage with a four horizontal period difference.

11. The OLED display of claim 10, further comprising a scan signal generator between the display area and the light emission signal generator.

12. The OLED display of claim 11, wherein a previous stage scan signal is applied during the latter two of the four horizontal periods.

13. The OLED display of claim 12, wherein each of the plurality of light emission signal stages comprises a first clock input terminal and a second clock input terminal that are configured to respectively receive two clock signals, a control terminal configured to receive the light emission signal from the light emission signal stage, and an output terminal configured to output the light emission signal, each of the plurality of light emission signal stages includes a high-level output portion and a low-level output portion, and the high-level output portion is configured to output a high voltage to the output terminal and the low-level output portion is configured to output a low voltage to the output terminal.

14. An organic light emitting diode (OLED) display comprising:
a display area comprising a plurality of pixel rows configured to emit light in response to a light emission signal;

a first light emission signal generator and a second light emission signal generator at opposite sides of the display area, and include a plurality of light emission signal stages connected to the plurality of pixel rows; and two first high voltage transmission lines and two second high voltage transmission lines at opposite sides of the display area and connected to the light emission signal generator, wherein the two first high voltage transmission lines are connected to a plurality of odd-numbered light emission signal stages among the plurality of light emission signal stages and the odd-numbered light emission signal stages are configured to sequentially receive a first high voltage from the first high voltage transmission line with a plurality of horizontal periods difference, the two second high voltage transmission lines are connected to a plurality of even-numbered light emission signal stages among the plurality of light emission signal stages and the odd-numbered light emission signal stages are configured to sequentially receive a second high voltage from the second high voltage transmission line with the plurality of horizontal periods difference, and the two first high voltage transmission lines are connected with each other and the two second high voltage transmission lines are connected with each other.

15. The OLED display of claim 14, wherein the two first high voltage transmission lines and the two second high voltage transmission lines are insulated from each other.

16. The OLED display of claim 15, wherein
the plurality of light emission signal stages comprise a first light emission signal stage, a second light emission signal stage, a third light emission signal stage, a fourth light emission signal stage, and a fifth light emission signal stage that are sequentially arranged and configured to sequentially receive a high voltage, the first light emission signal stage, the third light emission signal stage, and the fifth light emission signal stage are configured to receive a first high voltage from the first high voltage transmission line, and the second light emission signal stage and the fourth light emission signal stage are configured to receive a second high voltage from the second high voltage transmission line.

17. The OLED display of claim 16, wherein
the first light emission signal stage, the third light emission signal stage, and the fifth light emission signal stage are configured to sequentially receive the first high voltage with a four horizontal period difference, and the second light emission signal stage and the fourth light emission signal stage are configured to sequentially receive the second high voltage with a four horizontal period difference.

18. The OLED display of claim 17, further comprising:
a first scan signal generator between the display area and the first light emission signal generator; and a second scan signal generator between the display area and the second light emission signal generator.

19. The OLED display of claim 18, wherein a previous stage scan signal is applied during the latter two of the four horizontal periods.

* * * * *